US011024690B2

(12) United States Patent
Park et al.

(10) Patent No.: US 11,024,690 B2
(45) Date of Patent: *Jun. 1, 2021

(54) DISPLAY DEVICE AND METHOD FOR MANUFACTURING DISPLAY DEVICE

(71) Applicant: Samsung Display Co., Ltd., Yongin-Si (KR)

(72) Inventors: Joung-Keun Park, Asan-si (KR); Ki Wan Ahn, Seoul (KR); Joo Sun Yoon, Seoul (KR)

(73) Assignee: Samsung Display Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 16/566,819

(22) Filed: Sep. 10, 2019

(65) Prior Publication Data

US 2020/0006454 A1 Jan. 2, 2020

Related U.S. Application Data

(63) Continuation of application No. 15/866,220, filed on Jan. 9, 2018, now Pat. No. 10,418,433, which is a (Continued)

(30) Foreign Application Priority Data

Jun. 17, 2013 (KR) .................. 10-2013-0069111

(51) Int. Cl.
*H01L 27/32* (2006.01)
*H01L 51/52* (2006.01)

(52) U.S. Cl.
CPC ........ *H01L 27/3262* (2013.01); *H01L 27/322* (2013.01); *H01L 27/326* (2013.01);
(Continued)

(58) Field of Classification Search
CPC .................................................. H01L 27/3246
See application file for complete search history.

(56) References Cited

U.S. PATENT DOCUMENTS 7,335,919 B2 * 2/2008 Koo .................... H01L 27/1214
257/72
9,455,308 B2 9/2016 Park et al.
(Continued)

FOREIGN PATENT DOCUMENTS

CN 101359681 A 2/2009
JP 2007-095706 A 4/2007
(Continued)

OTHER PUBLICATIONS

Extended European Search Report, Application No. 14172743.8-1555, dated Nov. 17, 2014.

*Primary Examiner* — Thao P Le
(74) *Attorney, Agent, or Firm* — Innovation Counsel LLP

(57) ABSTRACT

Provided is a display device, including: a substrate; signal lines including a gate line, a data line, and a driving voltage line that collectively define an outer boundary of a pixel area; a transistor connected to the signal line; a first electrode extending across the pixel area and formed on the signal line and the transistor, and connected to the transistor, the first electrode having a first portion overlying only the signal line and the transistor, and a second portion comprising all of the first electrode not included in the first portion; a pixel defining layer formed on only the first portion of the first electrode; an organic emission layer formed on substantially the entire second portion but not on the first portion; and a second electrode formed on the pixel defining layer and the organic emission layer.

20 Claims, 39 Drawing Sheets

Related U.S. Application Data continuation of application No. 15/276,468, filed on Sep. 26, 2016, now Pat. No. 9,871,086, which is a continuation of application No. 14/723,105, filed on May 27, 2015, now Pat. No. 9,455,308, which is a continuation of application No. 14/304,827, filed on Jun. 13, 2014, now Pat. No. 9,059,124.

(52) U.S. Cl.
CPC ...... *H01L 27/3246* (2013.01); *H01L 27/3265* (2013.01); *H01L 27/3276* (2013.01); *H01L 51/5209* (2013.01)

(56) References Cited

U.S. PATENT DOCUMENTS

| | | | |
|---|---|---|---|
| 10,418,433 B2* | 9/2019 | Park | ............ H01L 27/326 |
| 2005/0269942 A1 | 12/2005 | Ahn et al. | |
| 2006/0125381 A1 | 6/2006 | Oh | |
| 2007/0222368 A1 | 9/2007 | Lee et al. | |
| 2011/0017999 A1 | 1/2011 | Choi | |
| 2013/0009154 A1 | 1/2013 | Choi et al. | |
| 2013/0062635 A1 | 3/2013 | Higo et al. | |
| 2013/0069067 A1 | 3/2013 | Youn | |
| 2013/0187132 A1 | 7/2013 | Ando et al. | |
| 2014/0159018 A1 | 6/2014 | Song et al. | |

FOREIGN PATENT DOCUMENTS

| | | |
|---|---|---|
| JP | 4306142 B2 | 5/2009 |
| JP | 4884864 B2 | 12/2011 |
| KR | 10-2006-0067057 A | 6/2006 |
| KR | 10-2011-0011942 A | 2/2011 |
| KR | 10-2011-0056994 A | 5/2011 |
| KR | 10-2011-0066808 A | 6/2011 |
| KR | 10-2011-0092068 A | 8/2011 |
| KR | 10-2012-0051727 A | 5/2012 |
| KR | 10-2013-0003399 A | 1/2013 |
| KR | 10-2013-0005854 A | 1/2013 |
| KR | 10-2013-0030650 A | 3/2013 |
| WO | 2011013522 A | 2/2011 |

* cited by examiner

DISPLAY DEVICE AND METHOD FOR MANUFACTURING DISPLAY DEVICE

CROSS-REFERENCE TO RELATED APPLICATION

This application is a continuation application of U.S. patent application Ser. No. 15/866,220, filed on Jan. 9, 2018, which claims priority to, and the benefit of, Ser. No. 15/276, 468, filed on Sep. 26, 2016 (now U.S. Pat. No. 9,871,086), which claims priority to, and the benefit of, Ser. No. 14/723, 105, filed on May 27, 2015 (now U.S. Pat. No. 9,455,308), which claims priority to, and the benefit of, U.S. patent application Ser. No. 14/304,827, filed on Jun. 13, 2014 (now U.S. Pat. No. 9,059,124), which claims priority to, and the benefit of, Korean Patent Application No. 10-2013-0069111 filed in the Korean Intellectual Property Office on Jun. 17, 2013, the entire contents of which are incorporated herein by reference.

BACKGROUND

(a) Technical Field

Embodiments of the present invention relate generally to display devices and their manufacture. More specifically, embodiments of the present invention relate to displays having increased emissive area.

(b) Description of the Related Art

A display device is a device displaying an image, and recently, an organic light emitting diode display has received attention as being potentially attractive for use in modem display devices.

Since the organic light emitting diode display has a self-emission characteristic and does not require a separate light source unlike a liquid crystal display device, it is possible to reduce the display's thickness and weight as compared to liquid crystal display devices. Further, the organic light emitting diode display has characteristics such as low power consumption, high luminance, and a high response speed.

An organic light emitting diode display in the related art includes an organic emission layer formed in a pixel area which does not overlap with a signal line. As an area of the organic emission layer is increased, an emission area of the display device is increased, thus increasing luminance. However, when the organic emission layer is formed to overlap with the signal line in order to increase emission area, emission efficiency of the organic emission layer is reduced.

The above information disclosed in this Background section is only for enhancement of understanding of the background of the invention and therefore it may contain information that does not form the prior art that is already known in this country to a person of ordinary skill in the art.

SUMMARY

The present invention has been made in an effort to provide a display device and a manufacturing method therefor, the display device having advantages of preventing deterioration of emission efficiency while also increasing an emission area of the display device.

An exemplary embodiment of the present invention provides a display device, including: a substrate; signal lines including a gate line, a data line, and a driving voltage line that collectively define an outer boundary of a pixel area; a transistor connected to the signal line; a first electrode extending across the pixel area, formed on the signal line and the transistor, and connected to the transistor, the first electrode having a first portion overlying only the signal line and the transistor, and a second portion comprising all of the first electrode not included in the first portion; a pixel defining layer formed on only the first portion of the first electrode; an organic emission layer formed on substantially the entire second portion but not on the first portion; and a second electrode formed on the pixel defining layer and the organic emission layer.

The organic emission layer may not be formed on the pixel defining layer.

The display device may further include a first capacitor electrode and a second capacitor electrode formed on the substrate and overlapping each other with a first insulating layer therebetween, in which the organic emission layer may overlap the first capacitor electrode and the second capacitor electrode, and the pixel defining layer may not overlap either the first capacitor electrode or the second capacitor electrode.

The transistor may include a semiconductor layer, a gate insulating layer formed on the semiconductor layer, and a gate electrode formed on the gate insulating layer, in which the gate electrode may include a first layer and a second layer positioned on the first layer, the first capacitor electrode may be formed on the same layer as the semiconductor layer of the transistor, the second capacitor electrode may be formed on the same layer as the first layer of the gate electrode of the transistor, and the first insulating layer may be the gate insulating layer.

The first layer of the gate electrode may include a transparent conductor, and the second layer of the gate electrode may include a low-resistive conductor.

The display device may further include a first capacitor electrode and a second capacitor electrode formed on the substrate and overlapping other with a first insulating layer therebetween, in which the organic emission layer may not overlap either the first capacitor electrode or the second capacitor electrode, and the pixel defining layer may overlap the first capacitor electrode and the second capacitor electrode.

The transistor may include a semiconductor layer, a gate insulating layer formed on the semiconductor layer, and a gate electrode formed on the gate insulating layer, in which the first capacitor electrode may be formed on the same layer as the semiconductor layer of the transistor, the second capacitor electrode may be formed on the same layer as the gate electrode of the transistor, and the first insulating layer may be the gate insulating layer.

The display device may further include a third capacitor electrode overlapping the first capacitor electrode and the second capacitor electrode, in which the first capacitor electrode and the second capacitor electrode may overlap each other with the first insulating layer therebetween, so as to form a first storage capacitor, and the second capacitor electrode and the third capacitor electrode may overlap each other with the second insulating layer therebetween, so as to form a second storage capacitor.

Another exemplary embodiment of the present invention provides a method of manufacturing a display device, including: forming signal lines on a substrate, the signal lines including a gate line, a data line, and a driving voltage line collectively defining an outer boundary of a pixel area; forming a transistor on the substrate, the transistor being connected to the signal line; forming a first electrode extending across the pixel area, the first electrode being connected to the transistor, and disposed on the signal line and the transistor, the first electrode further having a first portion and a second portion, the first portion overlying only the signal line and the transistor, and the second portion comprising all of the first electrode not included in the first portion; forming a pixel defining layer on only the first portion of the first electrode; forming an organic emission layer disposed on substantially the entire second portion but not on the first portion; and forming a second electrode on the pixel defining layer and the organic emission layer.

The organic emission layer may not be formed on the pixel defining layer.

The manufacturing method of a display device may further include forming a first capacitor electrode and a second capacitor electrode on the substrate, the first capacitor electrode and second capacitor electrode overlapping each other with a first insulating layer therebetween, in which the organic emission layer may overlap the first capacitor electrode and the second capacitor electrode, and the pixel defining layer may not overlap either the first capacitor electrode or the second capacitor electrode.

The forming of the transistor may include forming a semiconductor layer on the substrate, forming a gate insulating layer on the semiconductor layer, and forming a gate electrode on the gate insulating layer, in which the gate electrode may include a first layer and a second layer positioned on the first layer, the first capacitor electrode may be formed on the same layer as the semiconductor layer of the transistor, and the second capacitor electrode may be formed on the same layer as the first layer of the gate electrode of the transistor.

The manufacturing method of a display device may further include forming a first capacitor electrode and a second capacitor electrode on the substrate, the first capacitor electrode and the second capacitor electrode overlapping each other with a first insulating layer therebetween, in which the organic emission layer may not overlap either the first capacitor electrode or the second capacitor electrode, and the pixel defining layer may overlap the first capacitor electrode and the second capacitor electrode.

The forming of the transistor may include forming a semiconductor layer on the substrate, forming a gate insulating layer on the semiconductor layer, and forming a gate electrode on the gate insulating layer, in which the first capacitor electrode may be formed on the same layer as the semiconductor layer of the transistor, and the second capacitor electrode may be formed on the same layer as the gate electrode of the transistor.

The method of manufacturing a display device may further include forming a third capacitor electrode overlapping the first capacitor electrode and the second capacitor electrode, in which the first capacitor electrode and the second capacitor electrode may overlap each other with the first insulating layer therebetween, so as to form a first storage capacitor, and the second capacitor electrode and the third capacitor electrode may overlap each other with the second insulating layer therebetween, so as to form a second storage capacitor.

According to the exemplary embodiment of the present invention, it is possible to prevent reduction in emission efficiency while increasing an emission area of the display device.

BRIEF DESCRIPTION OF THE DRAWINGS

FIG. 5 is a cross-sectional view of a display device according to another exemplary embodiment of the present invention, and which is taken along line III-III of a display device for which FIG. 2 is representative.

FIG. 6 is a cross-sectional view of a display device according to another exemplary embodiment of the present invention, and which is taken along line IV-IV of a display device for which FIG. 2 is representative.

FIG. 10 is a cross-sectional view of a display device according to another exemplary embodiment of the present invention, and which is taken along line VIII-VIII of a display device for which FIG. 7 is representative.

FIG. 11 is a cross-sectional view of a display device according to another exemplary embodiment of the present invention, and which is taken along line IX-IX of a display device for which FIG. 7 is representative.

DETAILED DESCRIPTION OF THE EMBODIMENTS

Figure 1:
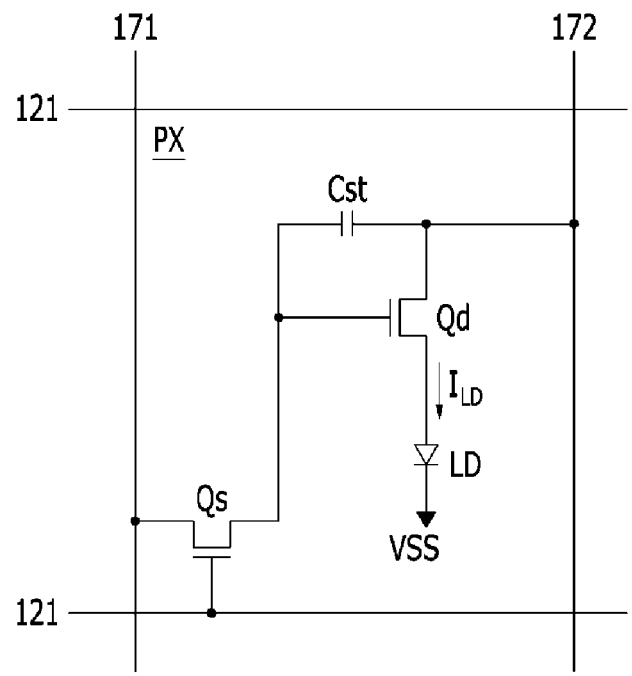
FIG. 1 is an equivalent circuit diagram of one pixel of a display device according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, a display device according to an exemplary embodiment of the present invention will be described with reference to the accompanying drawings.

First, a connection relationship between signal lines and pixels of a display device according to an exemplary embodiment of the present invention will be described with reference to FIG. 1. FIG. 1 is an equivalent circuit diagram of one pixel of a display device according to an exemplary embodiment of the present invention.

Referring to FIG. 1, the display device according to the exemplary embodiment of the present invention includes a plurality of signal lines 121, 171, and 172 and a pixel PX connected thereto. Here, the pixel PX means a minimum unit for displaying an image, and the display device displays the image according to a plurality of pixels PX.

The signal lines 121, 171, and 172 include a gate line 121 transferring a gate signal (or a scanning signal), a data line 171 transferring a data signal, and a driving voltage line 172 transferring a driving voltage. The gate lines 121 extend substantially in a row direction and are substantially parallel to each other, and the data lines 171 extend substantially in a column direction and are substantially parallel to each other. The driving voltage lines 172 extend substantially in a column direction, but may alternatively extend in a row direction, or be formed in a net or other shape.

One pixel PX includes a switching transistor Qs, a driving transistor Qd, a storage capacitor Cst, and an organic light emitting element LD.

The switching transistor Qs has a control terminal, an input terminal, and an output terminal. The control terminal is connected to the gate line 121, the input terminal is connected to the data line 171, and the output terminal is connected to the driving transistor Qd. The switching transistor Qs transfers a data signal received from the data line 171 to the driving transistor Qd in response to a scanning signal received from the gate line 121.

The driving transistor Qd also has a control terminal, an input terminal, and an output terminal, where the control terminal is connected to the output terminal of the switching transistor Qs, the input terminal is connected to the driving voltage line 172, and the output terminal is connected to the organic light emitting element LD. The driving transistor Qd transfers an output current $I_{LD}$ of which a magnitude varies according to a voltage applied between the control terminal and the output terminal.

The storage capacitor Cst is connected between the control terminal and the input terminal of the driving transistor Qd. The storage capacitor Cst charges a data signal applied to the control terminal of the driving transistor Qd and maintains the charged data signal even after the switching transistor Qs is turned off.

The organic light emitting element LD, for example an organic light emitting diode (OLED), includes an anode connected to the output terminal of the driving transistor Qd and a cathode connected to a common voltage Vss. The organic light emitting element LD emits light by varying an intensity according to the output current $I_{LD}$ of the driving transistor Qd, so as to thereby display an image. The organic light emitting element LD may include an organic material which uniquely expresses any one or one or more of primary colors such as three primary colors of red, green, and blue, and the organic light emitting diode display then displays a desired image according to a spatial sum of the various colors expressed. Further, the organic light emitting element LD may emit a white color constituted by the sum of the primary colors such as the three primary colors, and in this case, a color filter displaying any one of the primary colors such as the above three primary colors is formed in each pixel. Further, each pixel may include a pixel displaying one of the primary colors and a pixel displaying white, and in this case, the color filter may be formed only in the pixel displaying white.

The switching transistor Qs and the driving transistor Qd can be n-channel field effect transistors (FET), but at least one thereof may alternatively be a p-channel field effect transistor. Further, a connection relationship of the transistors Qs and Qd, the storage capacitor Cst, and the organic light emitting element LD may be changed.

Figure 2:
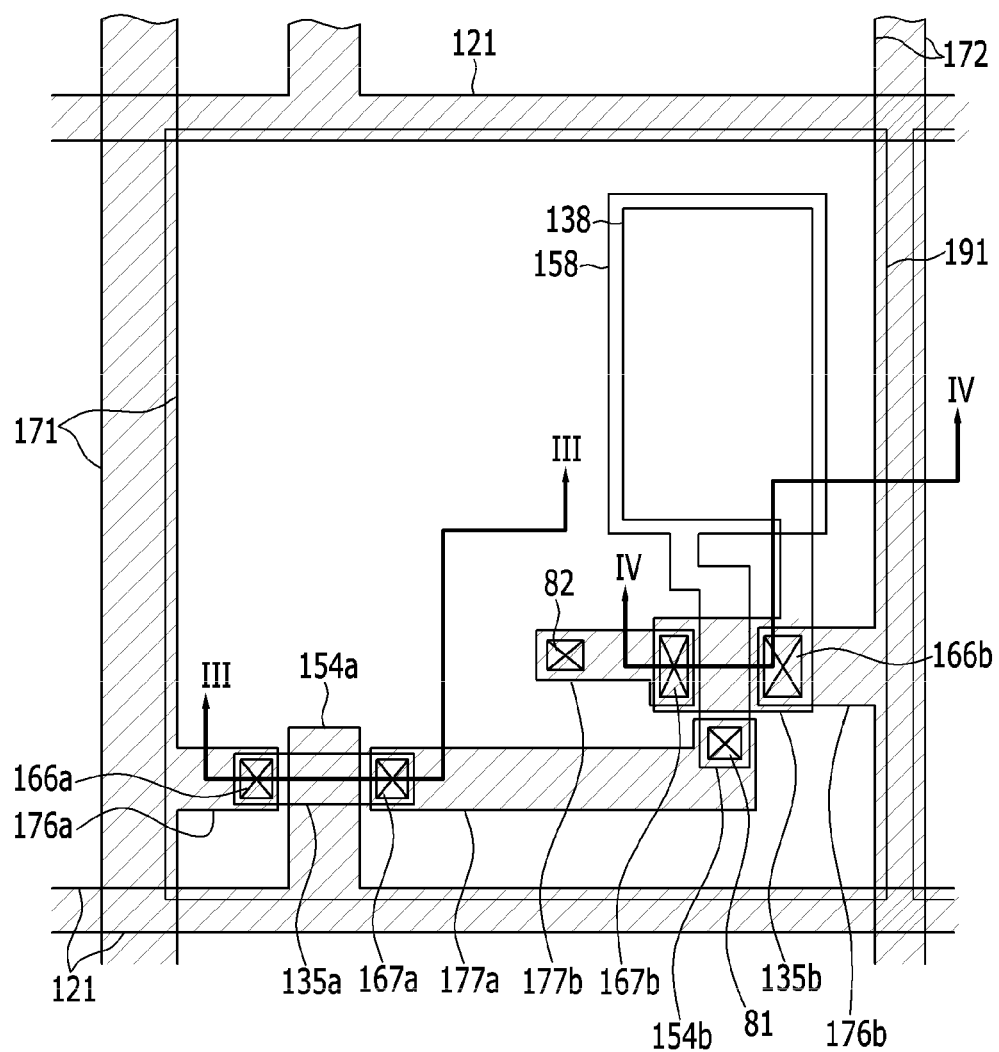
FIG. 2 is a layout view of the display device according to the exemplary embodiment of the present invention.
Figure 3:
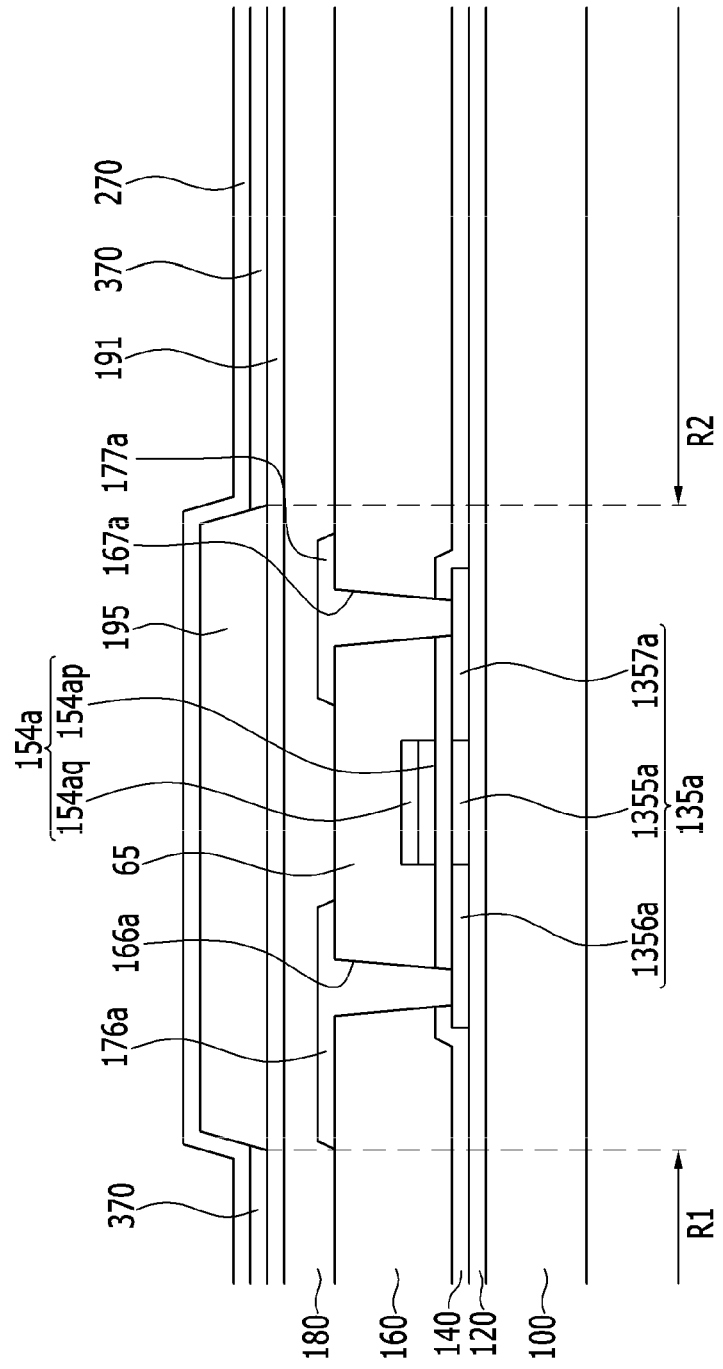
FIG. 3 is a cross-sectional view of the display device of FIG. 2 taken along line III-III.
Figure 4:
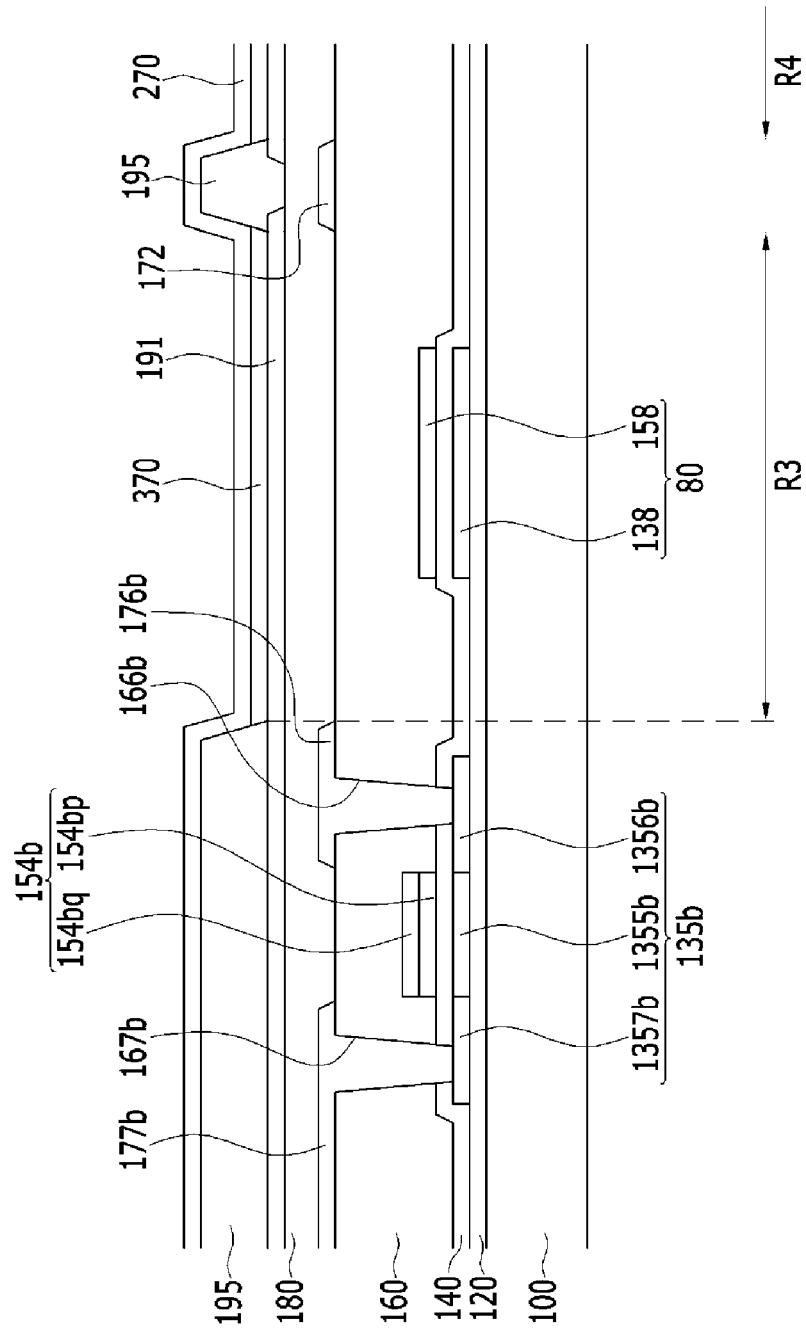
FIG. 4 is a cross-sectional view of the display device of FIG. 2 taken along line IV-IV.

Further details of the display device according to the exemplary embodiment of the present invention will be described with reference to FIGS. 2 to 4. FIG. 2 is a layout view of the display device according to the exemplary embodiment of the present invention, FIG. 3 is a cross-sectional view of the display device of FIG. 2 taken along line III-III, and FIG. 4 is a cross-sectional view of the display device of FIG. 2 taken along line IV-IV.

A buffer layer 120 is formed on a substrate 100.

The substrate 100 may be an insulating substrate made of glass, quartz, ceramic, plastic, or the like, or may be a metallic substrate made of stainless steel or the like.

The buffer layer 120 may be formed as a single layer of silicon nitride (SiNx) or as a double-layered structure in which silicon nitride (SiNx) and silicon oxide ($SiO_2$) are laminated. The buffer layer 120 serves to planarize a surface while preventing an undesired component such as an impurity or moisture from penetrating therethrough.

A first semiconductor 135a and a second semiconductor 135b, which are made of polysilicon, as well as a first capacitor electrode 138, are formed on the buffer layer 120.

The first semiconductor 135a includes a first channel region 1355a, as well as a first source region 1356a and a first drain region 1357a which are formed at both sides of the first channel region 1355a.

The second semiconductor 135b includes a second channel region 1355b, as well as a second source region 1356b and a second drain region 1357b which are formed at both sides of the second channel region 1355b.

The first channel region 1355a and the second channel region 1355b of the first semiconductor 135a and the second semiconductor 135b are polysilicon in which an impurity is not doped, that is, an intrinsic semiconductor. The first source region 1356a and the first drain region 1357a, and the second source region 1356b and the second drain region 1357b of the first semiconductor 135a and the second semiconductor 135b respectively, are polysilicon in which a conductive impurity is doped, that is, an impurity semiconductor.

The first capacitor electrode 138 is extended from the second source region 1356b of the second semiconductor 135b. Accordingly, the first capacitor electrode 138 is formed on the same layer as the second source region 1356b and thus is polysilicon in which a conductive impurity is doped, that is, an impurity semiconductor.

The impurity doped in the first source region 1356a and the first drain region 1357a, and the second source region 1356b and the second drain region 1357b of the first semiconductor 135a and the second semiconductor 135b, as well as in the first capacitor electrode 138, may be any one of a p-type impurity and an n-type impurity.

A gate insulating layer 140 is formed on the first semiconductor 135a and the second semiconductor 135b, as well as the first capacitor electrode 138.

The gate insulating layer 140 may be a single layer or a multilayer including at least one of tetra ethyl ortho silicate (TEOS), silicon nitride, and silicon oxide.

A gate line 121, a first gate electrode 154a, a second gate electrode 154b, and a second capacitor electrode 158 are formed on the gate insulating layer 140.

The gate line 121 is elongated in a horizontal direction to transfer a gate signal, and the first gate electrode 154a protrudes toward the first semiconductor 135a from the gate line 121.

The gate line 121, the first gate electrode 154a, and the second gate electrode 154b include lower layers 154ap and 154bp made of a transparent conductor, and upper layers 154aq and 154bq made of an opaque conductor including a low resistive conductor such as tungsten, molybdenum, aluminum, or an alloy thereof.

The second capacitor electrode 158 is connected with the second gate electrode 154b and overlaps the first capacitor electrode 138. The second capacitor electrode 158 is formed on the same layer as the lower layers 154ap and 154bp of the gate line 121, the first gate electrode 154a, and the second gate electrode 154b. Accordingly, the second capacitor electrode 158 is made of a transparent conductor.

The first capacitor electrode 138 and the second capacitor electrode 158 form a first storage capacitor 80 by using the gate insulating layer 140 as a dielectric material. As described above, the first capacitor electrode 138 is formed as a semiconductor layer, and the second capacitor electrode 158 is formed as a transparent conductor. Accordingly, the first storage capacitor 80 has a transparent layer, and as a result, it is possible to prevent reduction in an aperture ratio of the display device due to the formation of the first storage capacitor 80.

A first interlayer insulating layer 160 is formed on the gate line 121, the first gate electrode 154a, the second gate electrode 154b, and the second capacitor electrode 158. The first interlayer insulating layer 160 may be formed of tetra ethyl ortho silicate (TEOS), silicon nitride, silicon oxide, or the like, just as the gate insulating layer 140.

A first source contact hole 166a exposing the first source region 1356a of the first semiconductor 135a, a first drain contact hole 167a exposing the first drain region 1357a of the first semiconductor 135a, a second source contact hole 166b exposing the second source region 1356b of the second semiconductor 135b, and a second drain contact hole 167b exposing the second drain region 1357b of the second semiconductor 135b are each formed through the first interlayer insulating layer 160 and the gate insulating layer 140. In the first interlayer insulating layer 160 also has a first contact hole 81 formed therethrough, the first contact hole 81 exposing the second gate electrode 154b.

A data line 171 including the first source electrode 176a, a driving voltage line 172 including a second source electrode 176b, and a first drain electrode 177a and a second drain electrode 177b are formed on the first interlayer insulating layer 160.

The data line 171 transfers a data signal and extends in a direction to cross the gate line 121.

The driving voltage line 172 transfers a predetermined voltage and extends to be generally parallel to the data line 171.

The first source electrode 176a protrudes toward the first semiconductor 135a from the data line 171, and the second source electrode 176b protrudes toward the second semiconductor 135b from the driving voltage line 172.

The first source electrode 176a is connected with the first source region 1356a through the first source contact hole 166a, and the second source electrode 176b is connected with the second source region 1356b through the second source contact hole 166b.

The first drain electrode 177a faces the first source electrode 176a, and the first drain electrode 177a is connected with the first drain region 1357a through the first drain contact hole 167a. Similarly, the second drain electrode 177b faces the second source electrode 176b, and the second drain electrode 177b is connected with the second drain region 1357b through the second drain contact hole 167b.

The first drain electrode 177a is extended along (i.e. generally parallel to) the gate line and is electrically connected with the second gate electrode 154b through the first contact hole 81.

The second interlayer insulating layer 180 is formed on the data line 171 (including the first source electrode 176a), the driving voltage line 172 (including the second source electrode 176b), and the first drain electrode 177a and the second drain electrode 177b.

The second interlayer insulating layer 180 may be formed of the same material as the first interlayer insulating layer 160, and may have a second contact hole 82 formed therein and exposing the second drain electrode 177b.

A first electrode 191 is formed on the second interlayer insulating layer 180. The first electrode 191 may be an anode.

The first electrode 191 is connected with the second drain electrode 177b through the second contact hole 82.

The first electrode 191 is formed throughout one pixel area which is surrounded by two adjacent gate lines 121, the data line 171, the driving voltage line 172, and the like. Further, an edge of the first electrode 191 may overlap the two adjacent gate lines 121, the data line 171, and the driving voltage line 172.

A pixel defining layer 195 is formed on the first electrode 191. The pixel defining layer 195 is formed in a region which overlaps the gate line 121, the data line 171, the driving voltage line 172, the first gate electrode 154a, the second gate electrode 154b, the first source electrode 176a and the first drain electrode 177a, the second source electrode 176b and the second drain electrode 177b, and the like, and is formed as an opaque layer. The pixel defining layer 195 is shown as the hatched area of FIG. 2.

A display device according to another exemplary embodiment of the present invention may further include an additional opaque layer in addition to that overlying the gate line 121, the data line 171, the driving voltage line 172, the first gate electrode 154a, the second gate electrode 154b, the first source electrode 176a and the first drain electrode 177a, and the second source electrode 176b and the second drain electrode 177b. In this case, the pixel defining layer 195 may overlap the additional opaque layer.

The pixel defining layer 195 may include a resin such as polyacrylates or polyimides, a silica-based inorganic material, and the like.

An organic emission layer 370 is formed on parts of the first electrode 191 that are not covered by the pixel defining layer 195.

As such, the organic emission layer 370 is formed in the region which does not overlap the pixel defining layer 195, and the organic emission layer 370 is not positioned on the pixel defining layer 195. Accordingly, in the pixel area, the organic emission layer 370 does not overlap the gate line 121, the data line 171, the driving voltage line 172, the first gate electrode 154a, the second gate electrode 154b, the first source electrode 176a and the first drain electrode 177a, the second source electrode 176b and the second drain electrode 177b, and the like, each of which are covered by the opaque layer.

The organic emission layer 370 includes an emission layer, and may further include one or more of a hole-injection layer (HIL), a hole-transporting layer (HTL), an electron-transporting layer (ETL), and an electron-injection layer (EIL).

In the case where the organic emission layer 370 includes each of the hole-injection layer (HIL), the hole-transporting layer (HTL), the electron-transporting layer (ETL), and the electron-injection layer (EIL), the hole-injection layer (HIL) is positioned on the first electrode 191 which is an anode, and the hole-transporting layer, the emission layer, the electron-transporting layer, and the electron-injection layer may be sequentially laminated thereon.

The organic emission layer 370 may, for example, emit light of any one of the three primary colors of red, green and blue.

A second electrode 270 is formed on the pixel defining layer 195 and the organic emission layer 370.

The second electrode 270 is a cathode of the organic light emitting element. Accordingly, the first electrode 191, the organic emission layer 370, and the second electrode 270 together form the organic light emitting element LD.

The second electrode 270 is formed as a reflective layer, a transparent layer, or a transflective layer.

The reflective layer and the transflective layer are made of one or more metals from among magnesium (Mg), silver (Ag), gold (Au), calcium (Ca), lithium (Li), chromium (Cr), and aluminum (Al), as well as any alloy thereof. The reflective layer and the transflective layer are determined according to the thickness of their material, and the transflective layer may be formed by a metal layer having a thickness of 200 nm or less. The transparent layer is made of a material such as indium tin oxide (ITO), indium zinc oxide (IZO), or zinc oxide (ZnO).

As described above, the display device according to the exemplary embodiment of the present invention includes the first electrode 191 formed throughout the pixel area, the pixel defining layer 195 formed in the region overlapping the opaque signal wires of the pixel area, the organic emission layer 370 formed in areas which do not overlap with the pixel defining layer 195, and the second electrode 270 formed on the organic emission layer 370. Accordingly, as illustrated in FIGS. 3 and 4, the organic emission layer 370 emits light in a first region R1, a second region R2, a third region R3, and a fourth region R4 which do not overlap the opaque wire layer, so as to display an image. In this embodiment, the organic emission layer 370 is formed even in areas that traditionally do not have an emission layer present, such as a region between the gate line 121 and the first source electrode 176a and the first drain electrode 177a, and a region between the driving voltage line 172 and the first drain electrode 177a, in an existing display device. Accordingly, an emission area of the display device is increased relative to conventional display devices. The pixel defining layer 195 is only formed over the opaque signal wires, and as a result, an aperture ratio of the display device is increased. Even so, the organic emission layer 370 of the display device is formed in regions surrounded by the pixel defining layer 195 and is not formed over the pixel defining layer 195, and thus is not present, or is largely not present, over the opaque signal wires. As a result, by preventing the organic emission layer 370 from unnecessarily emitting light even in the region where the image is not displayed, it is possible to prevent deterioration of emission efficiency while increasing an emission area of the display device.

Figure 5:
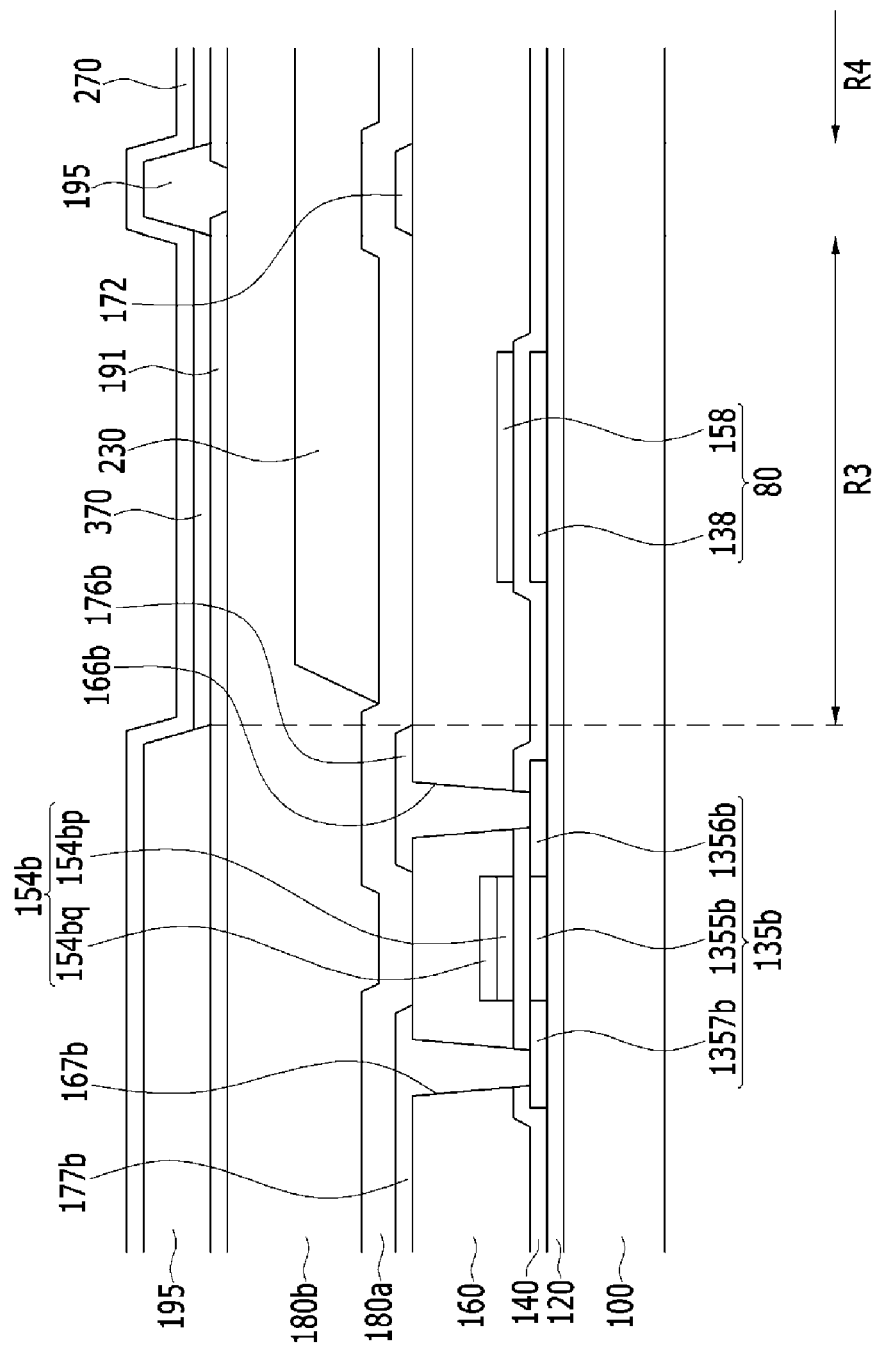

Next, a display device according to another exemplary embodiment of the present invention will be described with reference to FIGS. 5 and 6, in addition to FIG. 2. FIG. 5 is a cross-sectional view of a display device according to another exemplary embodiment of the present invention, which is an alternate cross-sectional view of the display device of FIG. 2 taken along line III-III., and FIG. 6 is a cross-sectional view of a display device according to another exemplary embodiment of the present invention, which is another alternate cross-sectional view of the display device of FIG. 2 taken along line IV-IV.

Figure 6:
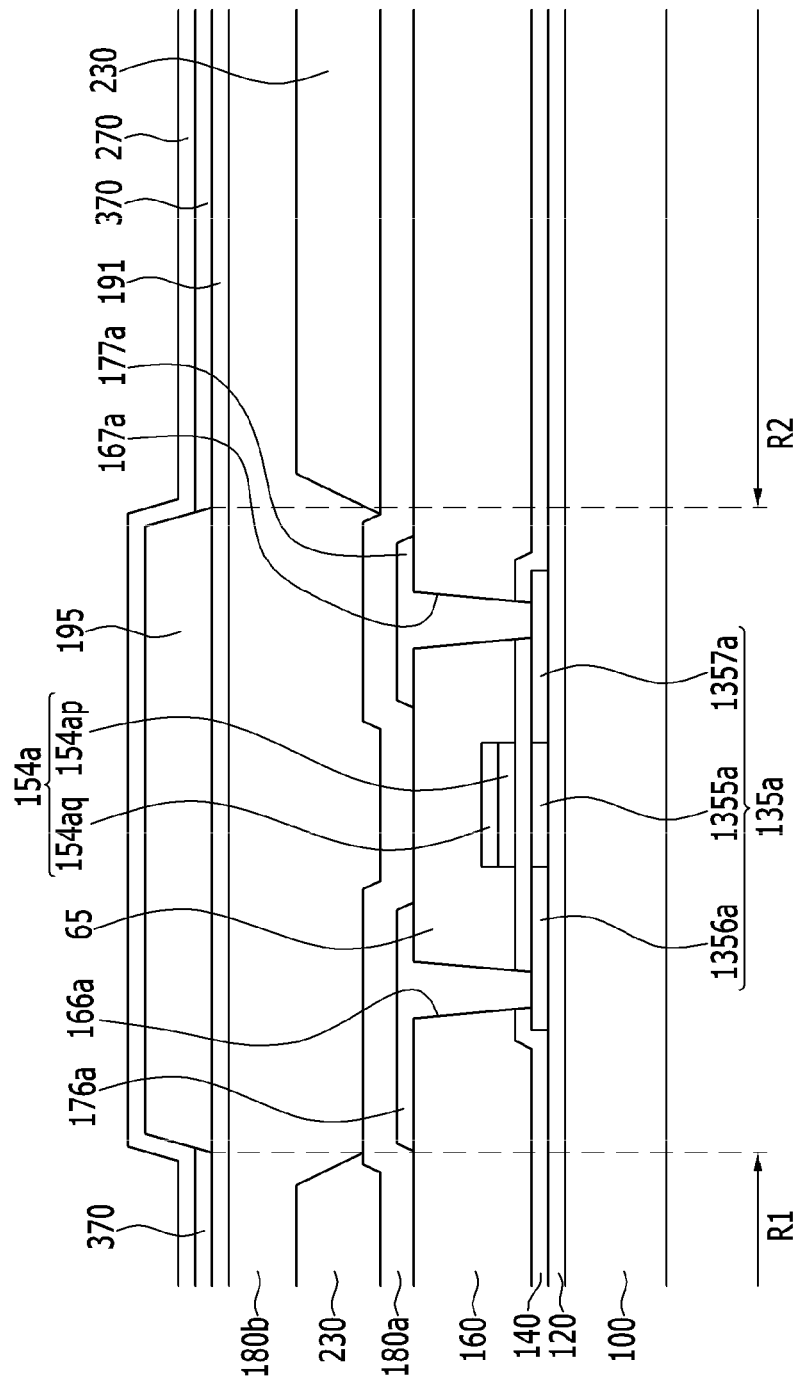

Referring to FIGS. 5 and 6 together with FIG. 2, the display device according to this exemplary embodiment is similar to the display device according to the exemplary embodiment described with reference to FIGS. 2 to 4. The detailed description for like constituent elements is omitted.

A buffer layer 120 is formed on a substrate 100, and a first semiconductor 135a and a second semiconductor 135b made of polysilicon, as well as a first capacitor electrode 138 are formed on the buffer layer 120.

The first semiconductor 135a includes a first source region 1356a and a first drain region 1357a which are formed at both sides of a first channel region 1355a.

The second semiconductor 135b includes a second channel region 1355b, as well as a second source region 1356b and a second drain region 1357b which are formed at both sides of the second channel region 1355b.

The first capacitor electrode 138 is extended from the second source region 1356b of the second semiconductor 135b.

A gate insulating layer 140 is formed on the first semiconductor 135a and the second semiconductor 135b, as well as the first capacitor electrode 138.

A gate line 121, a first gate electrode 154a, a second gate electrode 154b, and a second capacitor electrode 158 are formed on the gate insulating layer 140.

The gate line 121 is elongated in a horizontal direction to transfer a gate signal, and the first gate electrode 154a protrudes toward the first semiconductor 135a from the gate line 121.

The gate line 121, the first gate electrode 154a, and the second gate electrode 154b may be made of an opaque conductor including tungsten, molybdenum, aluminum or an alloy thereof.

The second capacitor electrode 158 is connected with the second gate electrode 154b and overlaps the first capacitor electrode 138. The second capacitor electrode 158 is formed on the same layer as that of the gate line 121, the first gate electrode 154a, and the second gate electrode 154b.

A first interlayer insulating layer 160 is formed on the gate line 121, the first gate electrode 154a, the second gate electrode 154b, and the second capacitor electrode 158.

A first source contact hole 166a exposing the first source region 1356a of the first semiconductor 135a, a first drain contact hole 167a exposing the first drain region 1357a of the first semiconductor 135a, a second source contact hole 166b exposing the second source region 1356b of the second semiconductor 135b, and a second drain contact hole 167b exposing the second drain region 1357b of the second semiconductor 135b are formed in the first interlayer insulating layer 160 and the gate insulating layer 140. A first contact hole 81 exposing the second gate electrode 154b is formed in the first interlayer insulating layer 160.

A data line 171 including the first source electrode 176a, a driving voltage line 172 including a second source electrode 176b, as well as a first drain electrode 177a and a second drain electrode 177b are formed on the first interlayer insulating layer 160.

The first source electrode 176a is connected with the first source region 1356a through the first source contact hole 166a, and the second source electrode 176b is connected with the second source region 1356b through the second source contact hole 166b.

The first drain electrode 177a faces the first source electrode 176a, and the first drain electrode 177a is connected with the first drain region 1357a through the first drain contact hole 167a. Similarly, the second drain electrode 177b faces the second source electrode 176b, and the second drain electrode 177b is connected with the second drain region 1357b through the second drain contact hole 167b.

The first drain electrode 177a extends generally parallel to the gate line and is electrically connected with the second gate electrode 154b through the first contact hole 81.

The first capacitor electrode 138 and the second capacitor electrode 158 form a first storage capacitor 80 by using the gate insulating layer 140 as a dielectric material.

On the data line 171 including the first source electrode 176a are formed the driving voltage line 172 including the second source electrode 176b, the first drain electrode 177a and the second drain electrode 177b, as well as third interlayer insulating layer 180.

The third interlayer insulating layer 180a may be made of the same material as the first interlayer insulating layer 160.

A color filter 230 is formed on the third interlayer insulating layer 180a. The color filter 230 may display one of the primary colors such as red, green and blue.

The color filter 230 may not be formed in a region overlapping transistors Qs and Qd, and may be formed throughout one pixel area. The color filters 230 may not be formed in at least some of the pixel areas among a plurality of pixel areas, and the pixel areas where the color filters 230 are not formed may display white.

A fourth interlayer insulating layer 180b is formed on the third interlayer insulating layer 180a and color filter 230.

The third interlayer insulating layer 180a and the fourth interlayer insulating layer 180b have a second contact hole 82 exposing a second drain electrode 177b.

A first electrode 191 is formed on the fourth interlayer insulating layer 180b. The first electrode 191 may be an anode.

The first electrode 191 is connected with the second drain electrode 177b through the second contact hole 82.

The first electrode 191 is formed throughout one pixel area which is surrounded by two adjacent gate lines 121, the data line 171, the driving voltage line 172, and the like. Further, an edge of the first electrode 191 may overlap the two adjacent gate lines 121, the data line 171, and the driving voltage line 172.

A pixel defining layer 195 is formed on the first electrode 191. The pixel defining layer 195 is formed to overlap the gate line 121, the data line 171, the driving voltage line 172, the first gate electrode 154a, the second gate electrode 154b, the first source electrode 176a and the first drain electrode 177a, the second source electrode 176b and the second drain electrode 177b, the capacitor electrodes 138, 158, and 178, and the like, which are formed as one or more opaque layers.

A display device according to another exemplary embodiment of the present invention may further include an additional opaque layer in addition to the gate line 121, the data line 171, the driving voltage line 172, the first gate electrode 154a, the second gate electrode 154b, the first source electrode 176a and the first drain electrode 177a, and the second source electrode 176b and the second drain electrode 177b, and in this case, the pixel defining layer 195 may be formed in a region overlapping the additional opaque layer.

An organic emission layer 370 is formed on that portion of the first electrode 191 which is not covered by the pixel defining layer 195. The organic emission layer 370 does not overlap the pixel defining layer 195. Accordingly, the organic emission layer 370 also does not overlap any of the gate line 121, the data line 171, the driving voltage line 172, the first gate electrode 154a, the second gate electrode 154b, the first source electrode 176a and the first drain electrode 177a, the second source electrode 176b and the second drain electrode 177b, the capacitor electrodes 138, 158, and 178, and the like, which are formed as opaque layer(s) in the pixel area.

The organic emission layer 370 may display white. Further, in the organic emission layer 370, emission materials emitting red light, green light, and blue light may be deposited so that the emission materials display a composite light of a white color.

A second electrode 270 is formed on the pixel defining layer 195 and the organic emission layer 370.

The second electrode 270 is a cathode of the organic light emitting element. Accordingly, the first electrode 191, organic emission layer 370, and the second electrode 270 form the organic light emitting element LD.

As described above, the display device according to the exemplary embodiment of the present invention includes the first electrode 191 formed throughout the pixel area, the pixel defining layer 195 formed to overlap the opaque signal lines of the pixel area, the organic emission layer 370 formed so as not to overlap the pixel defining layer 195, and the second electrode 270 formed on the organic emission layer 370. Accordingly, as illustrated in FIGS. 5 and 6, the organic emission layer 370 emits light in a first region R1, a second region R2, a third region R3, and a fourth region R4 which do not overlap the opaque wire layer, to display an image. As such, the organic emission layer 370 is formed even in areas that traditionally do not have an emission layer present, such as a region between the gate line 121 and the first source electrode 176a and the first drain electrode 177a, and/or a region between the driving voltage line 172 and the first drain electrode 177a. Accordingly, an emission area of the display device is increased. The pixel defining layer 195 is only formed over the opaque signal wires, and as a result, an aperture ratio of the display device is increased. Even so, the organic emission layer 370 of the display device is formed in regions surrounded by the pixel defining layer 195 and is not formed over the pixel defining layer 195, and thus is not present, or is largely not present, over the opaque signal wires. As a result, by preventing the organic emission layer 370 from unnecessarily emitting light even in the region where the image is not displayed, it is possible to prevent reduction in emission efficiency while also increasing an emission area of the display device.

All of many features of the display device according to the exemplary embodiment described with reference to FIGS. 2 to 4 may be applied to the display device according to the exemplary embodiment.

Figure 7:
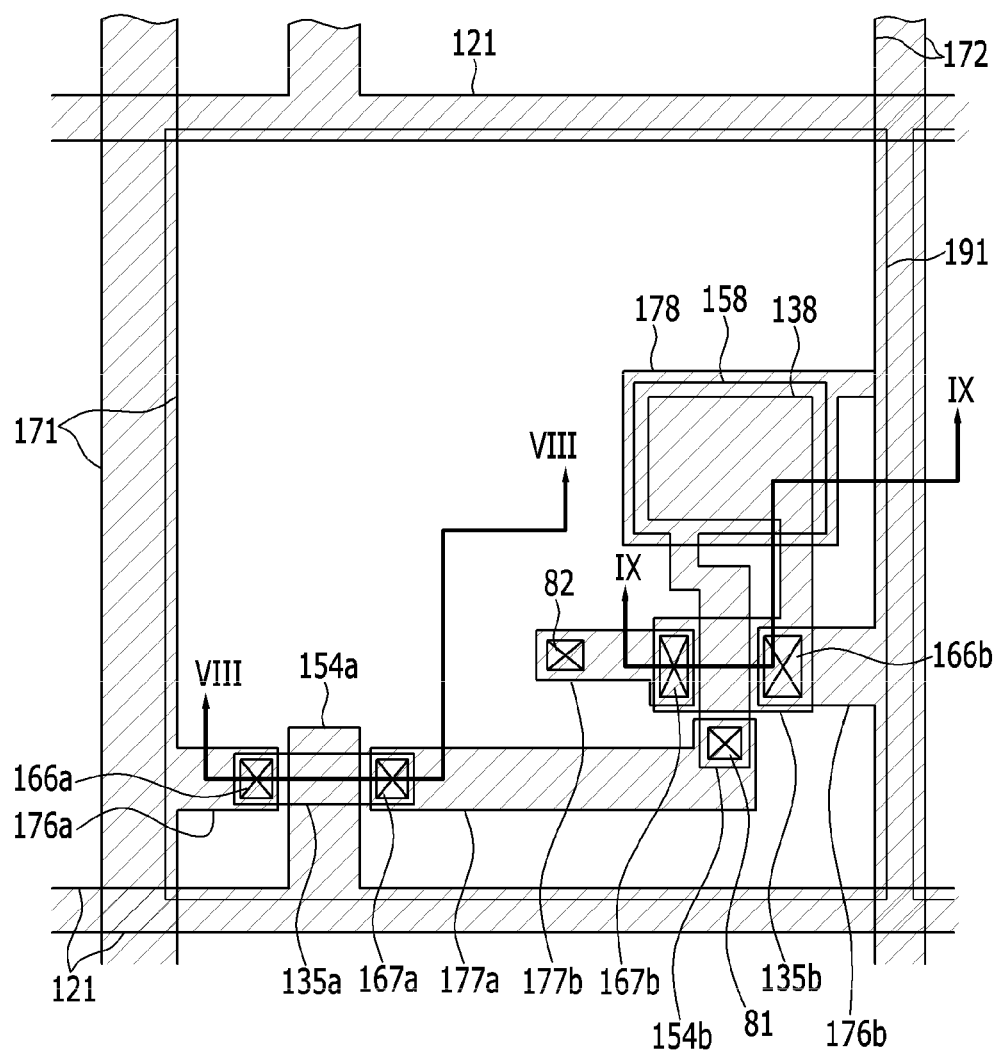
FIG. 7 is a layout view of a display device according to another exemplary embodiment of the present invention.

Next, a display device according to another exemplary embodiment of the present invention will be described with reference to FIGS. 7 to 9. FIG. 7 is a layout view of a display device according to another exemplary embodiment of the present invention, FIG. 8 is a cross-sectional view of the display device of FIG. 7 taken along line VIII-VIII, and FIG. 9 is a cross-sectional view of the display device of FIG. 7 taken along line IX-IX.

Figure 8:
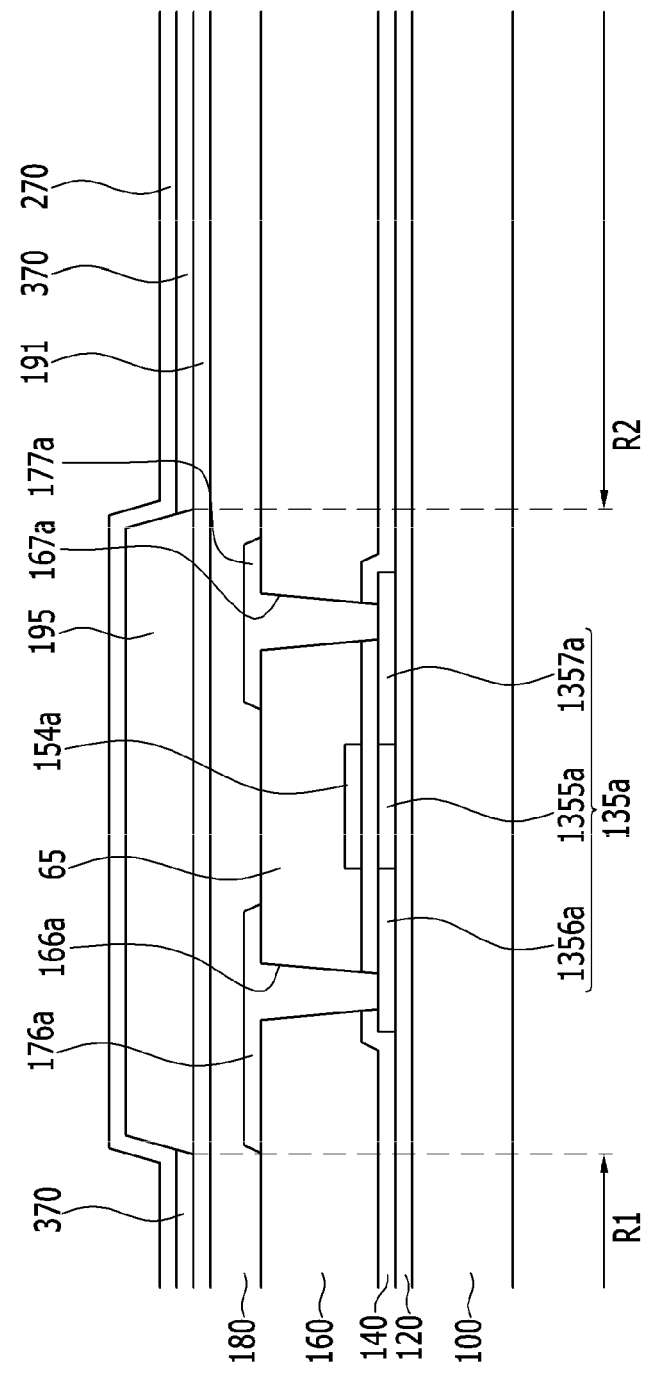
FIG. 8 is a cross-sectional view of the display device of FIG. 7 taken along line VIII-VIII.
Figure 9:
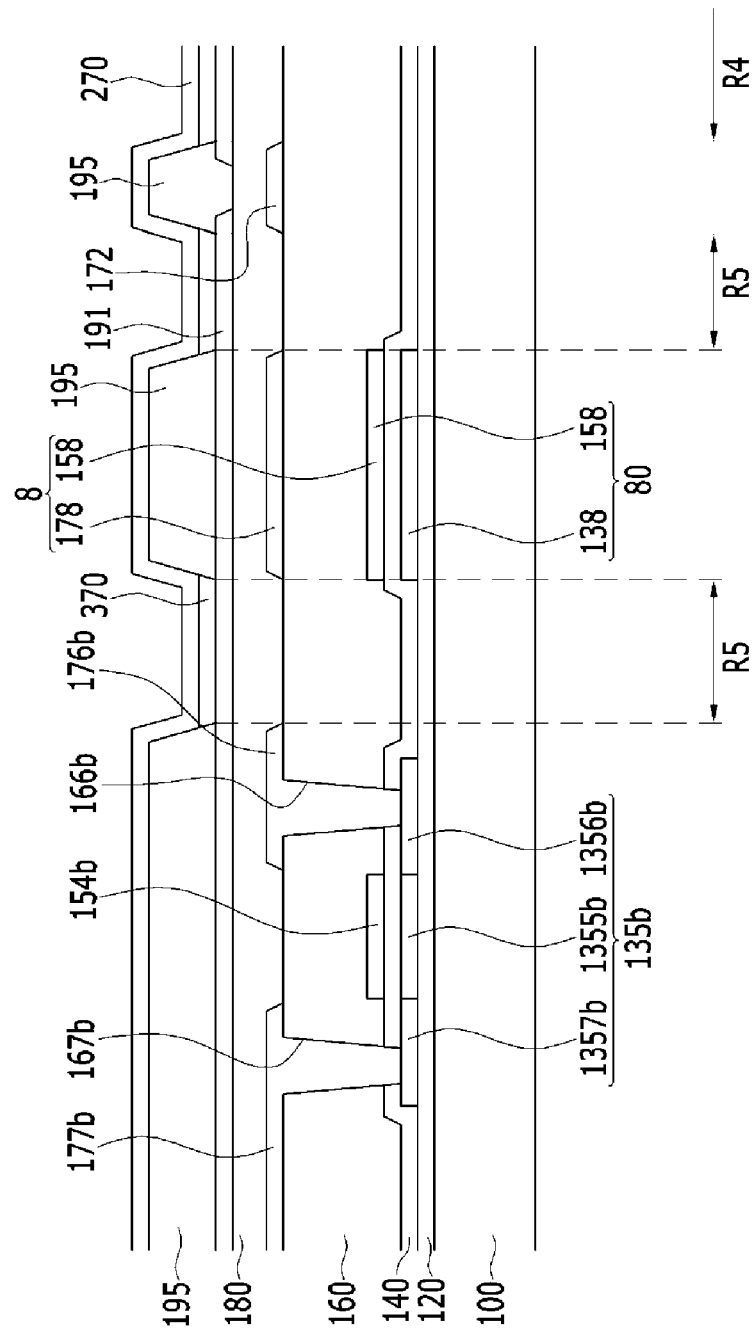
FIG. 9 is a cross-sectional view of the display device of FIG. 7 taken along line IX-IX.

Referring to FIGS. 7 to 9, the display device of this exemplary embodiment is similar to the display device according to the exemplary embodiment described with reference to FIGS. 2 to 4. Accordingly, detailed description for like constituent elements is omitted.

A buffer layer 120 is formed on a substrate 100, and a first semiconductor 135a and a second semiconductor 135b made of polysilicon, as well as a first capacitor electrode 138, are formed on the buffer layer 120.

The first semiconductor 135a includes a first channel region 1355a, and a first source region 1356a and a first drain region 1357a which are formed at both sides of the first channel region 1355a.

The second semiconductor 135b includes a second channel region 1355b, and a second source region 1356b and a second drain region 1357b which are formed at both sides of the second channel region 1355b.

The first capacitor electrode 138 is extended from the second source region 1356b of the second semiconductor 135b.

A gate insulating layer 140 is formed on the first semiconductor 135a and the second semiconductor 135b, as well as the first capacitor electrode 138.

A gate line 121, a first gate electrode 154a, a second gate electrode 154b, and a second capacitor electrode 158 are formed on the gate insulating layer 140.

The gate line 121 is elongated in a horizontal direction to transfer a gate signal, and the first gate electrode 154a protrudes toward the first semiconductor 135a from the gate line 121.

The gate line 121, the first gate electrode 154a, and the second gate electrode 154b may be made of an opaque conductor including tungsten, molybdenum, aluminum or an alloy thereof.

The second capacitor electrode 158 is connected with the second gate electrode 154b and overlaps the first capacitor electrode 138. The second capacitor electrode 158 is formed on the same layer as the gate line 121, the first gate electrode 154a, and the second gate electrode 154b.

A first interlayer insulating layer 160 is formed on the first gate electrode 154a, the second gate electrode 154b, and the second capacitor electrode 158.

A first source contact hole 166a exposing the first source region 1356a of the first semiconductor 135a, a first drain contact hole 167a exposing the first drain region 1357a of the first semiconductor 135a, a second source contact hole 166b exposing the second source region 1356b of the second semiconductor 135b, and a second drain contact hole 167b exposing the second drain region 1357b of the second semiconductor 135b are formed in the first interlayer insulating layer 160 and the gate insulating layer 140. A first contact hole 81 exposing the second gate electrode 154b is formed in the first interlayer insulating layer 160.

A data line 171 including the first source electrode 176a, a driving voltage line 172 including a second source electrode 176b, a first drain electrode 177a and a second drain electrode 177b, and a third capacitor electrode 178 are formed on the first interlayer insulating layer 160.

The first source electrode 176a is connected with the first source region 1356a through the first source contact hole 166a, and the second source electrode 176b is connected with the second source region 1356b through the second source contact hole 166b.

The first drain electrode 177a faces the first source electrode 176a, and the first drain electrode 177a is connected with the first drain region 1357a through the first drain contact hole 167a. Similarly, the second drain electrode 177b faces the second source electrode 176b, and the second drain electrode 177b is connected with the second drain region 1357b through the second drain contact hole 167b.

The first drain electrode 177a is extended along, or generally parallel to, the gate line and electrically connected with the second gate electrode 154b through the first contact hole 81.

The third capacitor electrode 178 protrudes from the driving voltage line 172 and overlaps the second capacitor electrode 158.

The first capacitor electrode 138 and the second capacitor electrode 158 form a first storage capacitor 80 by using the gate insulating layer 140 as a dielectric material, and the second capacitor electrode 158 and the third capacitor electrode 178 form a second storage capacitor 8 by using the first interlayer insulating layer 160 as a dielectric material. Referring to FIG. 5 together with FIG. 2, cross-sectional areas of the first capacitor electrode 138 and the second capacitor electrode 158 of the display device according to the present exemplary embodiment are smaller than those of the first capacitor electrode 138 and the second capacitor electrode 158 of the display device according to the exemplary embodiment illustrated in FIG. 2. However, in the case of the display device according to the present exemplary embodiment, the second storage capacitor 8 is further included in addition to the first storage capacitor 80, and as a result, while the storage capacitance of the storage capacitor Cst is not reduced, an area of the storage capacitor Cst may be reduced. Accordingly, it is possible to prevent reduction in aperture ratio of the display device due to the formation of the storage capacitor Cst.

The second interlayer insulating layer 180 is formed on the data line 171 including the first source electrode 176a, the driving voltage line 172 including the second source electrode 176b, and the first drain electrode 177a and the second drain electrode 177b.

The second interlayer insulating layer 180 may be formed of the same material as the first interlayer insulating layer 160, and has a second contact hole 82 exposing the second drain electrode 177b.

A first electrode 191 is formed on the second interlayer insulating layer 180. The first electrode 191 may be an anode.

The first electrode 191 is connected with the second drain electrode 177b through the second contact hole 82.

The first electrode 191 is formed throughout one pixel area which is surrounded by two adjacent gate lines 121, the data line 171, the driving voltage line 172, and the like. Further, an edge of the first electrode 191 may overlap the two adjacent gate lines 121, the data line 171, and the driving voltage line 172.

A pixel defining layer 195 is formed on the first electrode 191. The pixel defining layer 195 is formed to overlap the gate line 121, the data line 171, the driving voltage line 172, the first gate electrode 154a, the second gate electrode 154b, the first source electrode 176a and the first drain electrode 177a, the second source electrode 176b and the second drain electrode 177b, the capacitor electrodes 138, 158, and 178, and the like, which are formed as opaque layers.

A display device according to another exemplary embodiment of the present invention may further include an additional opaque layer in addition to the gate line 121, the data line 171, the driving voltage line 172, the first gate electrode 154a, the second gate electrode 154b, the first source electrode 176a and the first drain electrode 177a, and the second source electrode 176b and the second drain electrode 177b. In this case, the pixel defining layer 195 may overlap the additional opaque layer.

An organic emission layer 370 is formed only on that portion of the first electrode 191 which is not covered by the pixel defining layer 195. As such, the organic emission layer 370 is not positioned on the pixel defining layer 195. Accordingly, the organic emission layer 370 does not overlap any of the gate line 121, the data line 171, the driving voltage line 172, the first gate electrode 154a, the second gate electrode 154b, the first source electrode 176a and the first drain electrode 177a, the second source electrode 176b and the second drain electrode 177b, the capacitor electrodes 138, 158, and 178, and the like, which are formed as opaque layers in the pixel area.

The organic emission layer 370 may emit any one of light of three primary colors such as red, green and blue.

A second electrode 270 is formed on the pixel defining layer 195 and the organic emission layer 370.

The second electrode 270 is a cathode of the organic light emitting element. Accordingly, the first electrode 191, the organic emission layer 370, and the second electrode 270 form an organic light emitting element LD.

As described above, the display device according to the exemplary embodiment of the present invention includes the first electrode 191 formed throughout the pixel area, the pixel defining layer 195 overlapping the opaque signal lines of the pixel area, the organic emission layer 370 which does not overlap the pixel defining layer 195, and the second electrode 270 formed on the organic emission layer 370. Accordingly, as illustrated in FIGS. 6 and 7, the organic emission layer 370 emits light in a first region R1, a second region R2, a third region R3, a fourth region R4, and a fifth region R5 which do not overlap any of the opaque wire layers, so as to display an image. As such, the organic emission layer 370 is formed even in regions which are not display regions in conventional display devices, such as the region between the gate line 121 and the first source electrode 176a and the first drain electrode 177a, and a region between the driving voltage line 172 and the first drain electrode 177a. As a result, an emission area of the display device is increased. The pixel defining layer 195 only covers the opaque signal wires of the pixel area, and as a result, an aperture ratio of the display device is increased. Accordingly, the organic emission layer 370 is formed is formed in regions surrounded by the pixel defining layer 195 and so as not to overlap the pixel defining layer 195, and thus the organic emission layer 370 is formed in what has conventionally been a non-opening region. As a result, by preventing the organic emission layer 370 from unnecessarily emitting light even in the region where the image is not displayed, it is possible to prevent deterioration of emission efficiency while increasing an emission area of the display device.

Hereinabove, all of many features of the display devices according to the exemplary embodiment described with reference to FIGS. 2 to 4, and the exemplary embodiment described with reference to FIGS. 2, 5, and 6 may be applied to the display device according to the exemplary embodiment.

Figure 10:
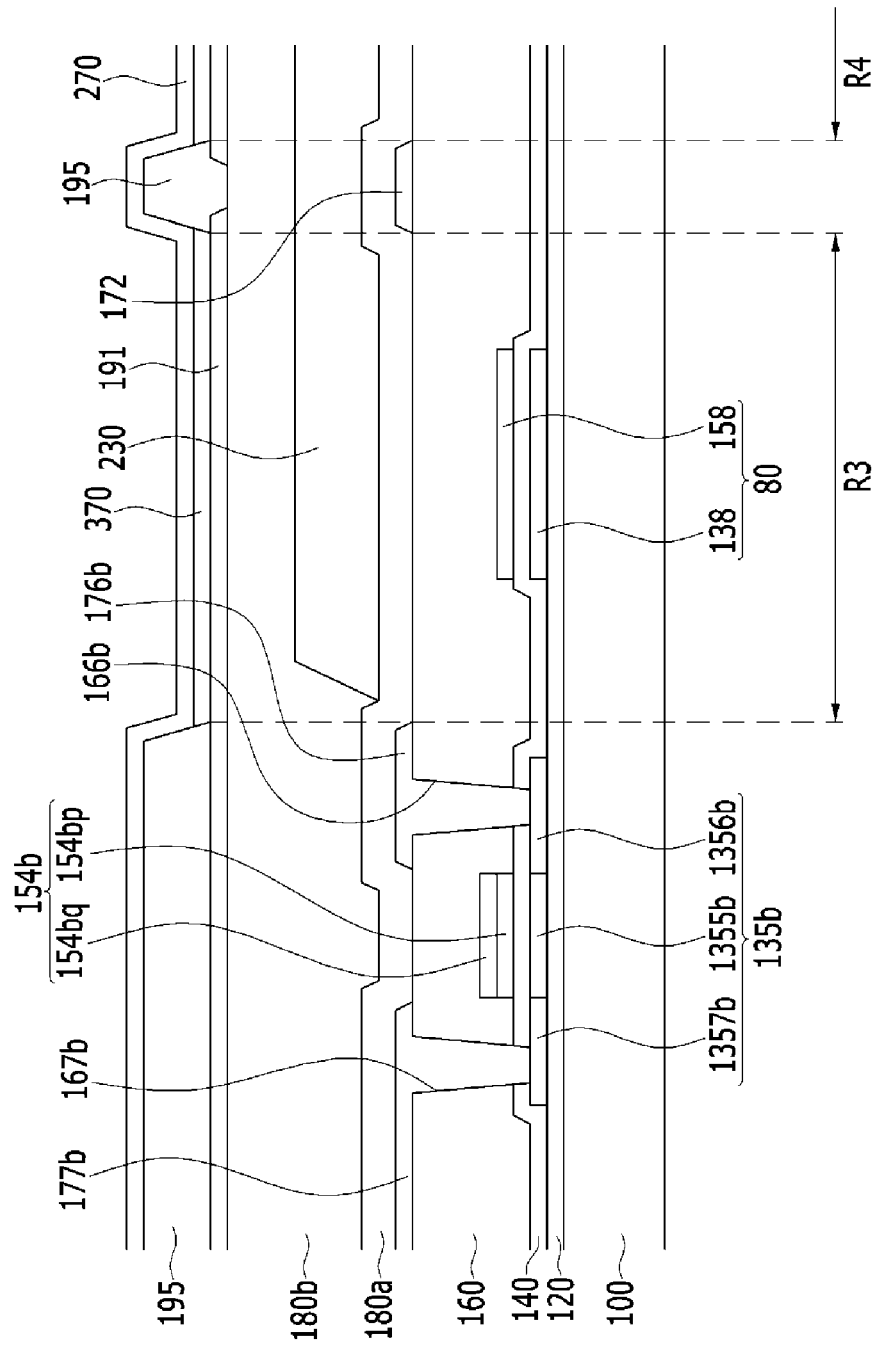
Figure 11:
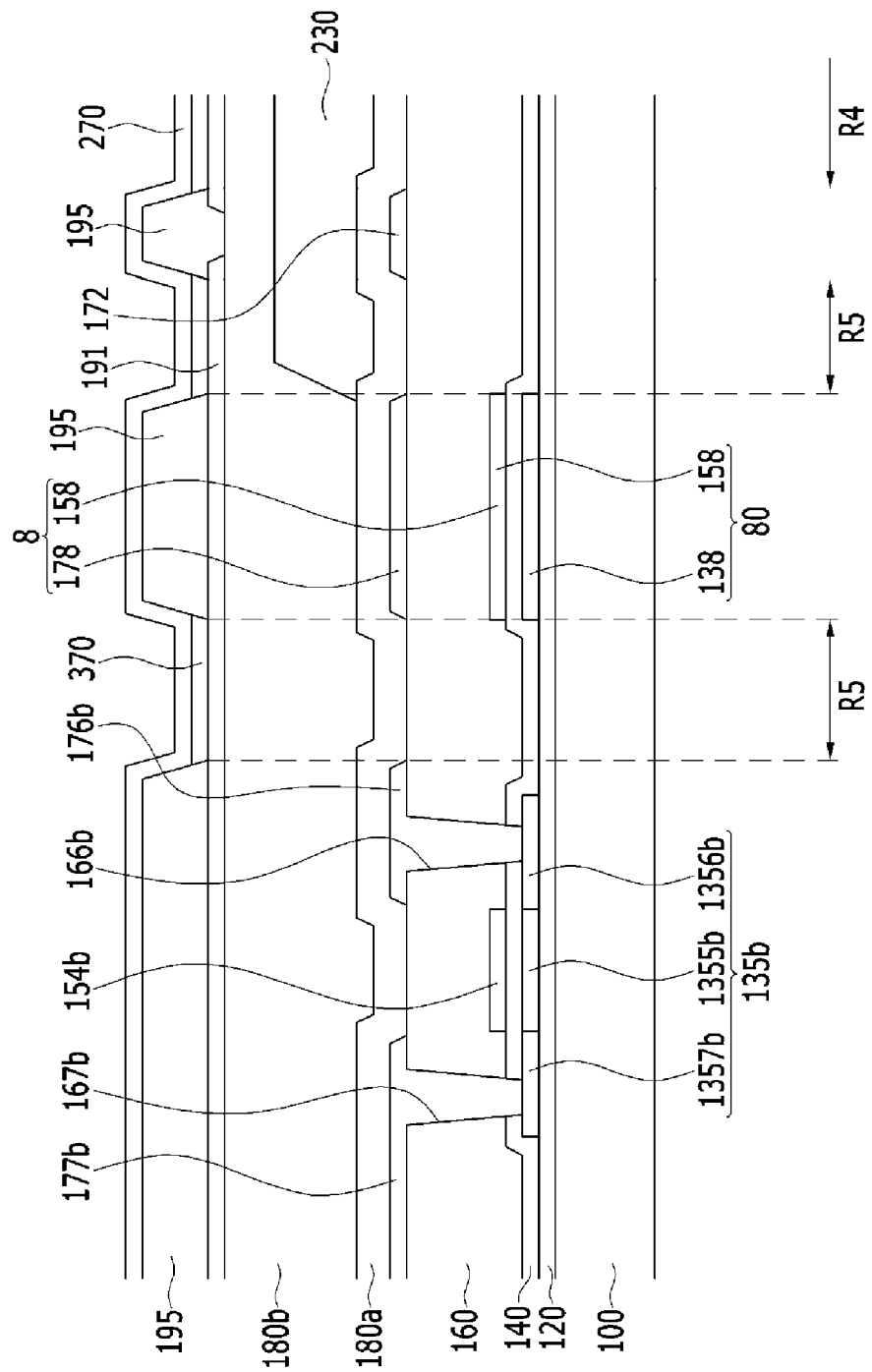

Next, a display device according to another exemplary embodiment of the present invention will be described with reference to FIGS. 10 and 11 together with FIG. 7. FIG. 10 is a cross-sectional view of a display device according to another exemplary embodiment of the present invention, which is an alternate cross-sectional view of the display device of FIG. 2 taken along line IV-IV. FIG. 11 is a cross-sectional view of a display device according to another exemplary embodiment of the present invention, which is an alternate cross-sectional view of the display device of FIG. 7 taken along line IX-IX.

Referring to FIGS. 7, 10, and 11, the display device according to the exemplary embodiment is similar to the display device according to the exemplary embodiment with reference to FIGS. 2 to 4, and the display device according to the exemplary embodiment described with reference to FIGS. 7 to 9. The detailed description for like constituent elements is omitted.

A buffer layer 120 is formed on a substrate 100, and a first semiconductor 135a and a second semiconductor 135b made of polysilicon, as well as a first capacitor electrode 138, are formed on the buffer layer 120.

The first semiconductor 135a includes a first channel region 1355a, and a first source region 1356a and a first drain region 1357a which are formed at both sides of the first channel region 1355a.

The second semiconductor 135b includes a second channel region 1355b, and a second source region 1356b and a second drain region 1357b which are formed at both sides of the second channel region 1355b.

The first capacitor electrode 138 is extended from the second source region 1356b of the second semiconductor 135b.

A gate insulating layer 140 is formed on the first semiconductor 135a and the second semiconductor 135b, as well as the first capacitor electrode 138.

A gate line 121, a first gate electrode 154a, a second gate electrode 154b, and a second capacitor electrode 158 are formed on the gate insulating layer 140.

The gate line 121 is elongated in a horizontal direction to transfer a gate signal, and the first gate electrode 154a protrudes toward the first semiconductor 135a from the gate line 121.

The gate line 121, the first gate electrode 154a, and the second gate electrode 154b may be made of an opaque conductor including tungsten, molybdenum, aluminum or an alloy thereof.

The second capacitor electrode 158 is connected with the second gate electrode 154b to overlap the first capacitor electrode 138. The second capacitor electrode 158 is formed on the same layer as the gate line 121, the first gate electrode 154a, and the second gate electrode 154b.

A first interlayer insulating layer 160 is formed on the gate line 121, the first gate electrode 154a, the second gate electrode 154b, and the second capacitor electrode 158.

A first source contact hole 166a exposing the first source region 1356a of the first semiconductor 135a, a first drain contact hole 167a exposing the first drain region 1357a of the first semiconductor 135a, a second source contact hole 166b exposing the second source region 1356b of the second semiconductor 135b, and a second drain contact hole 167b exposing the second drain region 1357b of the second semiconductor 135b are formed in the first interlayer insulating layer 160 and the gate insulating layer 140. A first contact hole 81 exposing the second gate electrode 154b is formed in the first interlayer insulating layer 160.

A data line 171 including the first source electrode 176a, a driving voltage line 172 including a second source electrode 176b, a first drain electrode 177a and a second drain electrode 177b, and a third capacitor electrode 178 are formed on the first interlayer insulating layer 160.

The first source electrode 176a is connected with the first source region 1356a through the first source contact hole 166a, and the second source electrode 176b is connected with the second source region 1356b through the second source contact hole 166b.

The first drain electrode 177a faces the first source electrode 176a, and the first drain electrode 177a is connected with the first drain region 1357a through the first drain contact hole 167a. Similarly, the second drain electrode 177b faces the second source electrode 176b, and the second drain electrode 177b is connected with the second drain region 1357b through the second drain contact hole 167b.

The first drain electrode 177a is extended generally parallel to the gate line and is electrically connected with the second gate electrode 154b through the first contact hole 81.

The third capacitor electrode 178 protrudes from the driving voltage line 172 and overlaps the second capacitor electrode 158.

The first capacitor electrode 138 and the second capacitor electrode 158 form a first storage capacitor 80 by using the gate insulating layer 140 as a dielectric material, and the second capacitor electrode 158 and the third capacitor electrode 178 form a second storage capacitor 8 by using the first interlayer insulating layer 160 as a dielectric material. Referring to FIG. 7 together with FIG. 2, cross-sectional areas of the first capacitor electrode 138 and the second capacitor electrode 158 of the display device according to the exemplary embodiment are smaller than those of the first capacitor electrode 138 and the second capacitor electrode 158 of the display device according to the exemplary embodiment illustrated in FIG. 2. However, in the case of the display device according to the exemplary embodiment, the second storage capacitor 8 is further included in addition to the first storage capacitor 80, and as a result, while storage capacitance of the storage capacitor Cst is not reduced, an area of the storage capacitor Cst may be reduced. Accordingly, it is possible to prevent reduction in an aperture ratio of the display device due to the formation of the storage capacitor Cst.

The third interlayer insulating layer 180a is formed on the data line 171 including the first source electrode 176a, the driving voltage line 172 including the second source electrode 176b, and the first drain electrode 177a and the second drain electrode 177b.

The third interlayer insulating layer 180a may be made of the same material as the first interlayer insulating layer 160.

A color filter 230 is formed on the third interlayer insulating layer 180a. The color filter 230 may display one of the primary colors such as three primary colors of red, green and blue.

The color filter 230 may not be formed in a region overlapping the transistors Qs and Qd, and may be formed throughout one pixel area. The color filters 230 may not be formed in at least some of the pixel areas among a plurality of pixel areas, and the pixel areas where the color filters 230 are not formed may display white.

On the third interlayer insulating layer 180a and color filter 230, a fourth interlayer insulating layer 180b is formed.

The third interlayer insulating layer 180a and the fourth interlayer insulating layer 180b have a second contact hole 82 exposing a second drain electrode 177b.

A first electrode 191 is formed on the fourth interlayer insulating layer 180b. The first electrode 191 may be an anode.

The first electrode 191 is connected with the second drain electrode 177b through the second contact hole 82.

The first electrode 191 is formed throughout one pixel area which is surrounded by two adjacent gate lines 121, the data line 171, the driving voltage line 172, and the like. Further, an edge of the first electrode 191 may overlap the two adjacent gate lines 121, the data line 171, and the driving voltage line 172.

A pixel defining layer 195 is formed on the first electrode 191. The pixel defining layer 195 overlaps the gate line 121, the data line 171, the driving voltage line 172, the first gate electrode 154a, the second gate electrode 154b, the first source electrode 176a and the first drain electrode 177a, the second source electrode 176b and the second drain electrode 177b, the capacitor electrodes 138, 158, and 178, and the like, which are formed as opaque layers.

A display device according to another exemplary embodiment of the present invention may further include an additional opaque layer in addition to the gate line 121, the data line 171, the driving voltage line 172, the first gate electrode 154a, the second gate electrode 154b, the first source electrode 176a and the first drain electrode 177a, and the second source electrode 176b and the second drain electrode 177b, and in this case, the pixel defining layer 195 may overlap this additional opaque layer as well.

An organic emission layer 370 is formed on the first electrode 191 but not overlapping the pixel defining layer 195. Accordingly, the organic emission layer 370 is formed so as not to overlap the gate line 121, the data line 171, the driving voltage line 172, the first gate electrode 154a, the second gate electrode 154b, the first source electrode 176a and the first drain electrode 177a, the second source electrode 176b and the second drain electrode 177b, the capacitor electrodes 138, 158, and 178, and the like, which are formed as opaque layers in the pixel area.

The organic emission layer 370 may display white. Further, in the organic emission layer 370, emission materials emitting red light, green light, and blue light may be laminated and thus may display a composite white light.

A second electrode 270 is formed on the pixel defining layer 195 and the organic emission layer 370.

The second electrode 270 is a cathode of the organic light emitting element. Accordingly, the first electrode 191, organic emission layer 370, and the second electrode 270 form an organic light emitting element LD.

As described above, the display device according to the exemplary embodiment of the present invention includes the first electrode 191 formed throughout the pixel area, the pixel defining layer 195 formed to overlap the opaque signal lines of the pixel area, the organic emission layer 370 formed so as not to overlap the pixel defining layer 195, and the second electrode 270 formed on the organic emission layer 370. Accordingly, as illustrated in FIGS. 10 and 11, the organic emission layer 370 emits light in a first region R1, a second region R2, a fourth region R4, and a fifth region R5 which do not overlap the opaque wire layer, so as to display an image. As such, the organic emission layer 370 is formed even in a region which is not conventionally used to display an image, and as a result, an emission area of the display device is increased. The pixel defining layer 195 is only formed over the opaque signal wires, and as a result, an aperture ratio of the display device is increased. Even so, the organic emission layer 370 of the display device is formed in regions surrounded by the pixel defining layer 195 and not formed over the pixel defining layer 195, and thus is not present, or is largely not present, over the opaque signal wires As a result, by preventing the organic emission layer 370 from unnecessarily emitting light even in the region where the image is not displayed, it is possible to prevent reduction in emission efficiency while increasing an emission area of the display device.

Hereinabove, any combination of features of the display devices according to the exemplary embodiment described with reference to FIGS. 2 to 4, the exemplary embodiment described with reference to FIGS. 2, 5, and 6, the exemplary embodiment described with reference to FIGS. 7 to 9, and the exemplary embodiment described with reference to FIGS. 7, 10, and 11 may be applied to the display device according to the exemplary embodiment.

Next, a manufacturing method of a display device according to an exemplary embodiment of the present invention will be described with reference to FIGS. 12 to 31 in addition to FIGS. 2 to 4. FIGS. 12 to 31 are process cross-sectional views illustrating a manufacturing method of a display device according to an exemplary embodiment of the present invention.

Figure 12:
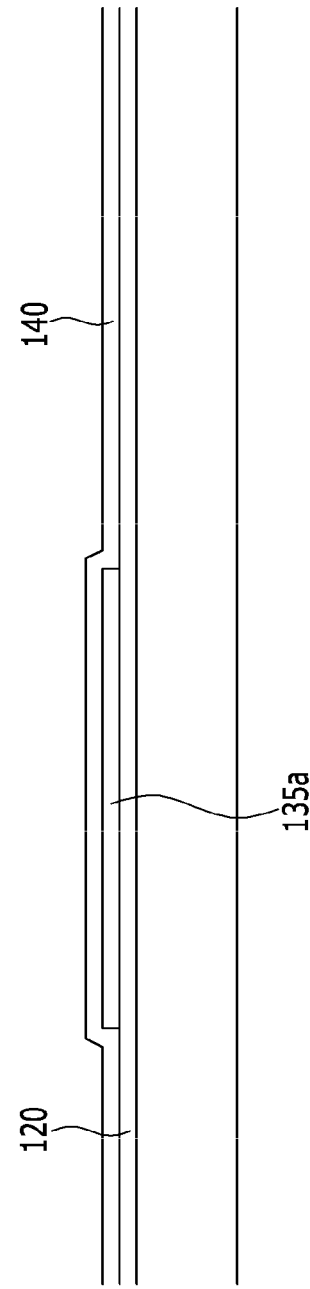
FIGS. 12, 13, 14, 15, 16, 17, 18, 19, 20, 21, 22, 23, 24, 25, 26, 27, 28, 29, 30, and 31 are cross-sectional views sequentially illustrating a method for manufacturing a display device according to an exemplary embodiment of the present invention.
Figure 13:
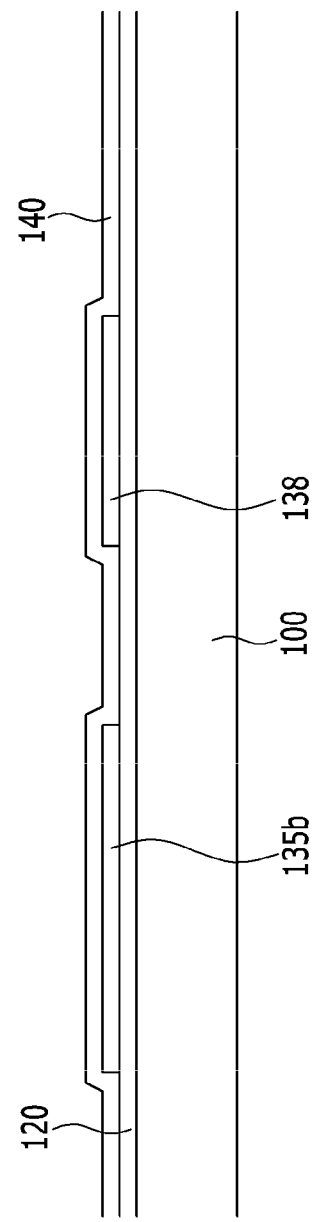

Referring to FIGS. 12 and 13, a buffer layer 120 is formed on a substrate 100, and a first semiconductor 135a and a second semiconductor 135b, as well as a first capacitor electrode 138, are formed on the buffer layer 120. In addition, a gate insulating layer 140 is formed on the first semiconductor 135a, the second semiconductor 135b, and the first capacitor electrode 138.

Figure 14:
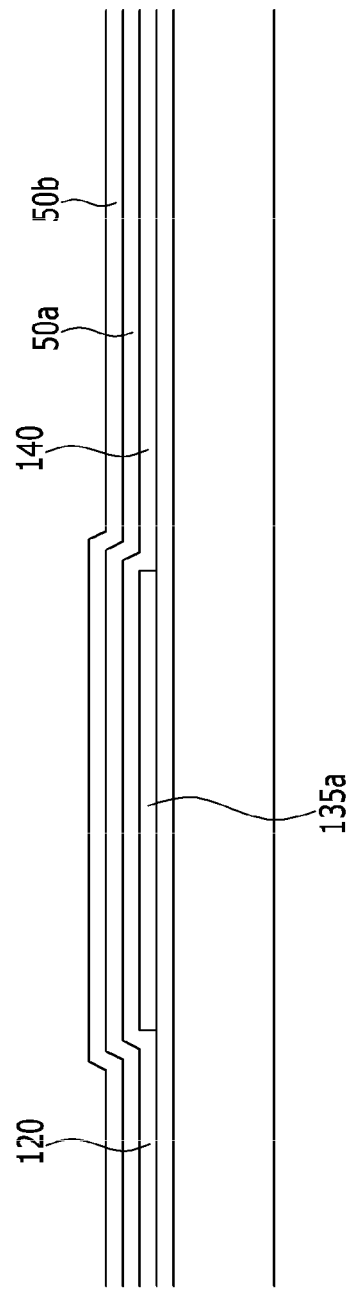
Figure 15:
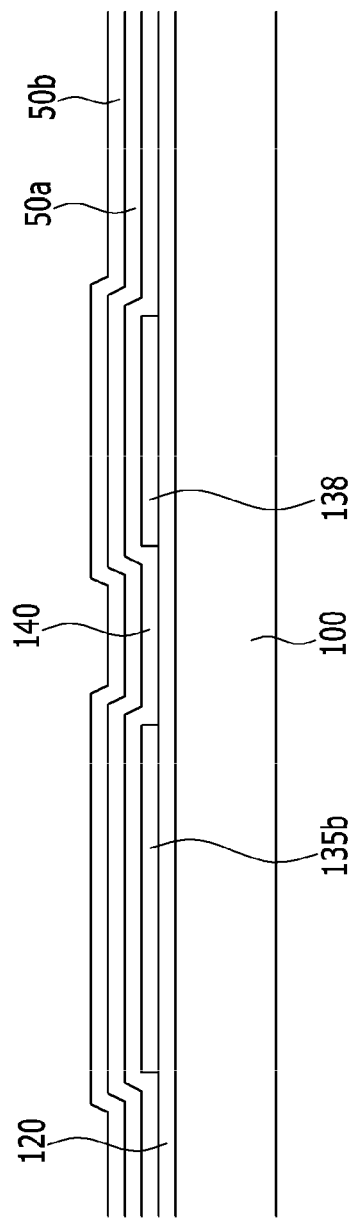
Figure 16:
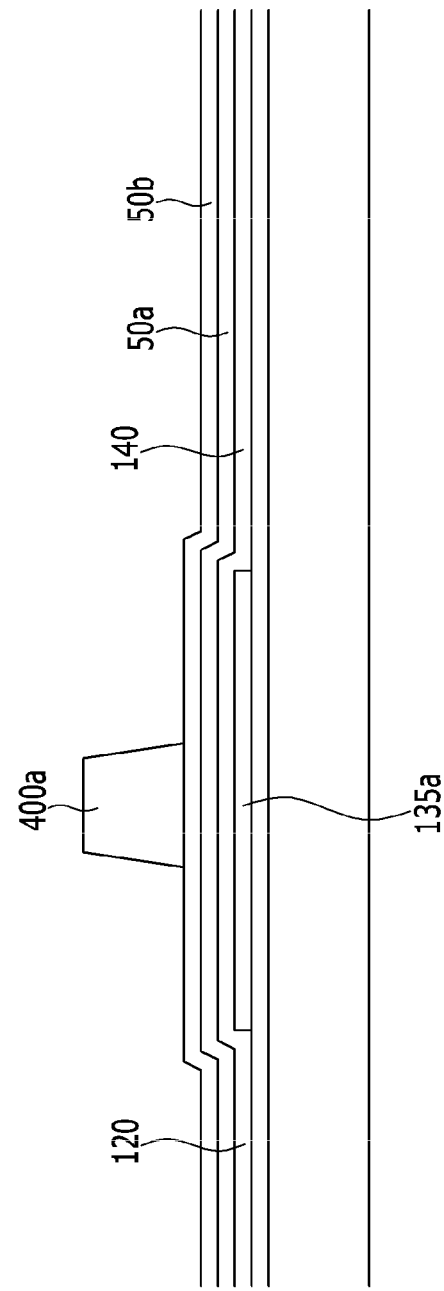
Figure 17:
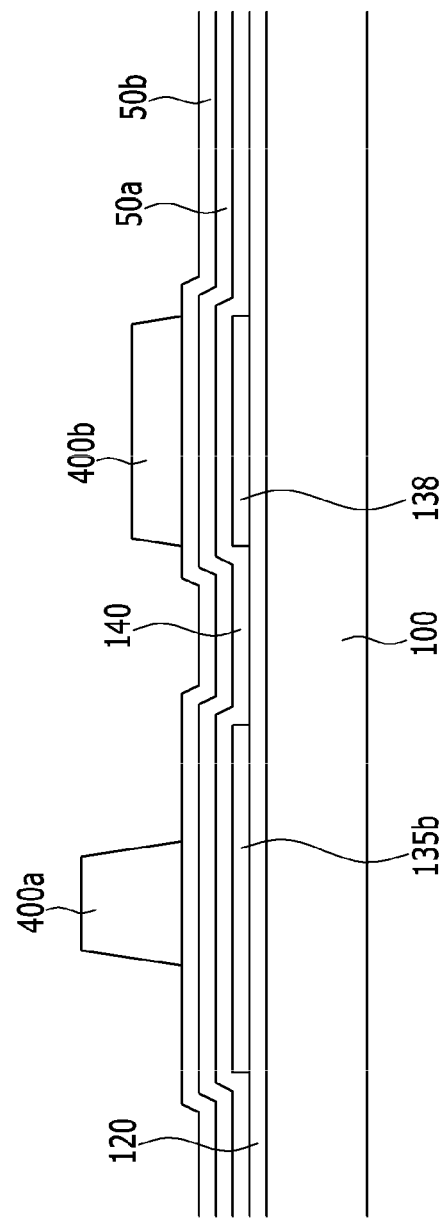

Referring to FIGS. 14 and 15, a first layer 50a made of a transparent conductor is deposited on the gate insulating layer 140, and a second layer 50b made of a low resistive conductor is deposited on the first layer 50a. A photosensitive film is deposited on the second layer 50b, and then exposed and printed to form a first photosensitive film pattern 400a and a second photosensitive film pattern 400b having different thicknesses, as illustrated in FIGS. 16 and 17. A thickness of the first photosensitive film pattern 400a is larger than that of the second photosensitive film pattern 400b. The first photosensitive film pattern 400a is formed at a position where the first gate electrode 154a and the second gate electrode 154b are to be formed, and the second photosensitive film pattern 400b is formed at a position where the second capacitor electrode 158 is to be formed.

Figure 18:
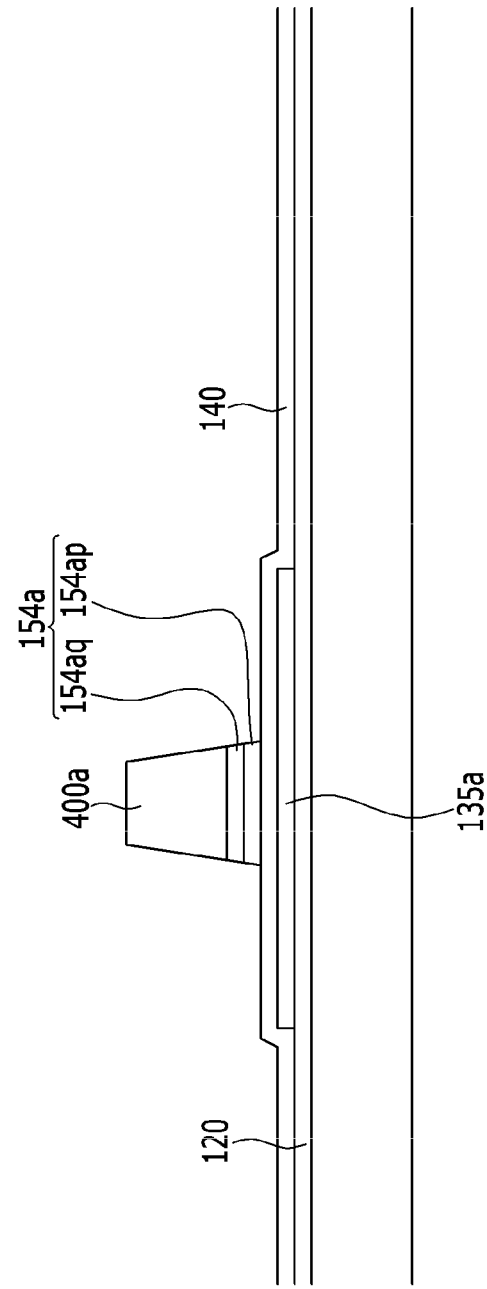
Figure 19:
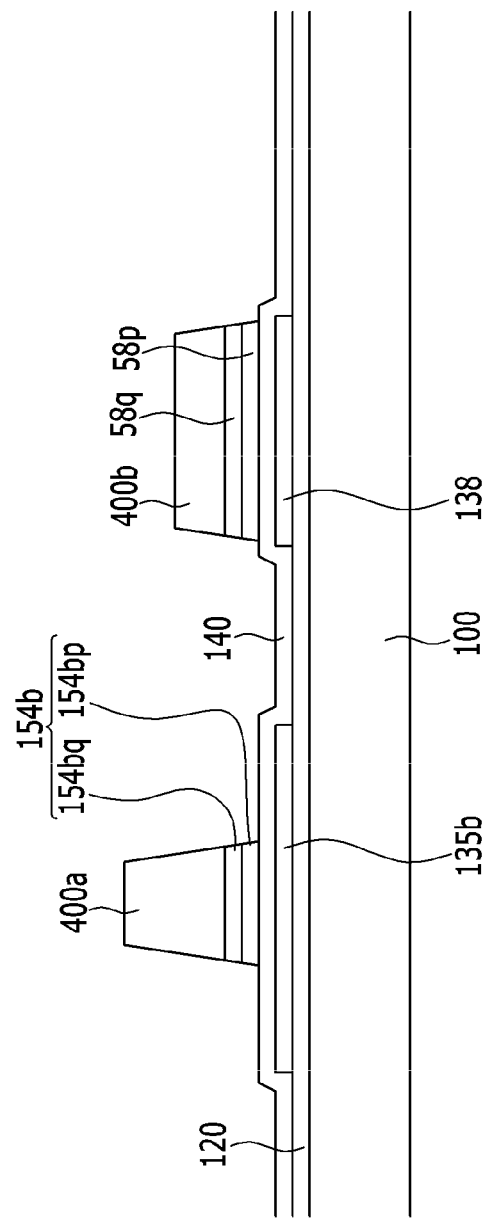

Referring to FIGS. 18 and 19, the second layer 50b and the first layer 50a are sequentially etched by using the first photosensitive film pattern 400a and the second photosensitive film pattern 400b as an etching mask, and then a first gate electrode 154a and a second gate electrode 154b including lower layers 154ap and 154bp and upper layers 154aq and 154bq are formed, and a first conductor pattern 58p and a second conductor pattern 58q are formed.

Figure 20:
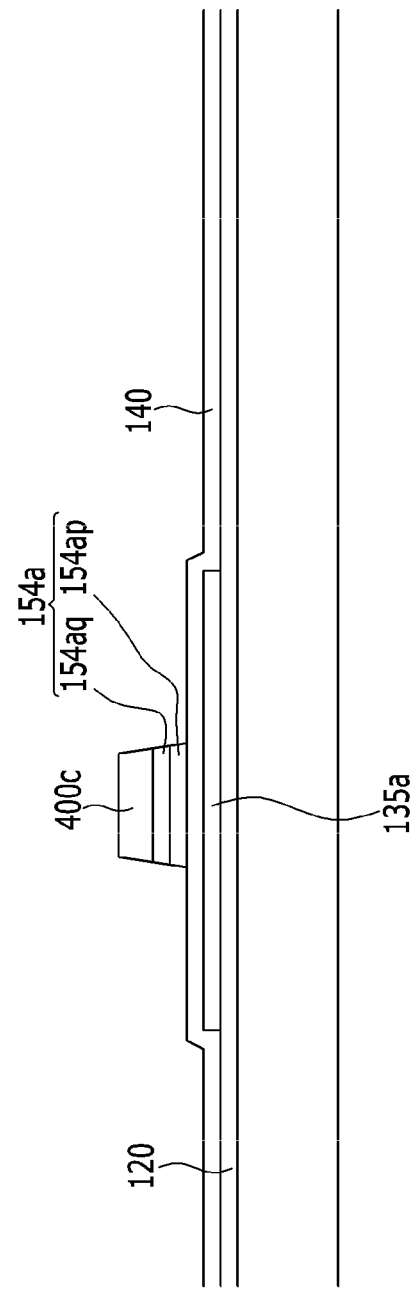
Figure 21:
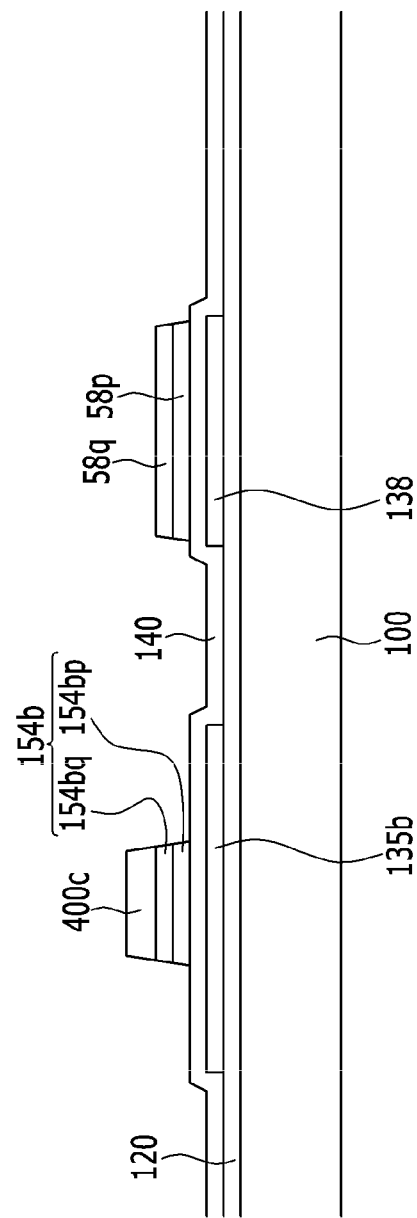

Next, the second photosensitive film pattern 400b is removed by ashing or the like, and a height of the first photosensitive film pattern 400a is decreased, forming a third photosensitive film pattern 400c as illustrated in FIGS. 20 and 21.

Figure 22:
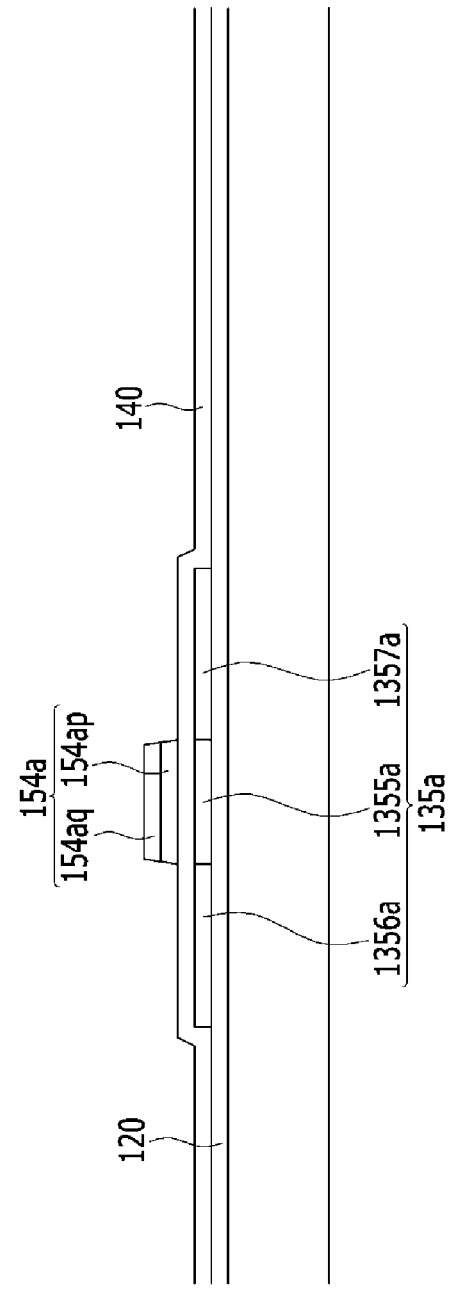
Figure 23:
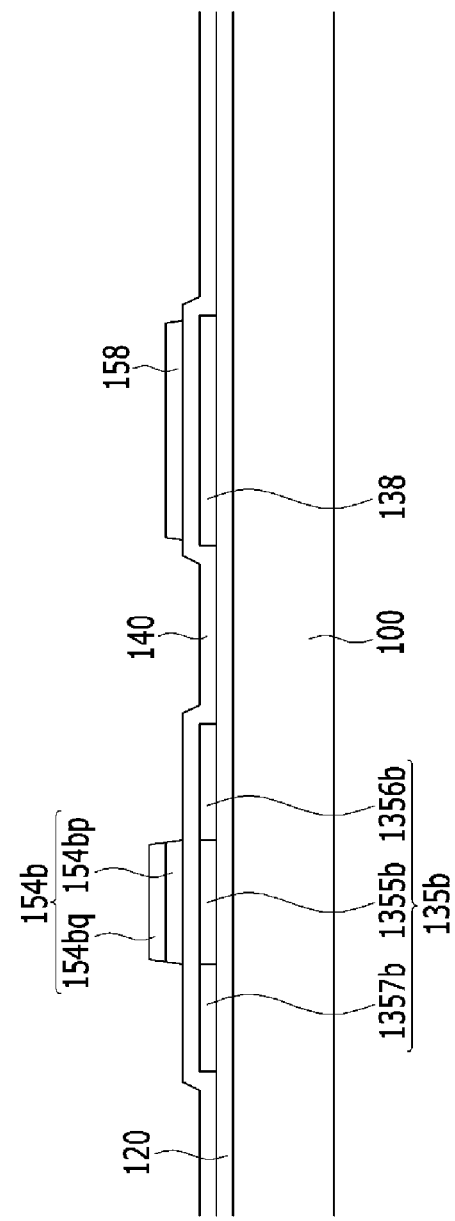

Next, the second conductor pattern 58q and the third photosensitive film pattern 400c are removed, and as a result, as illustrated in FIGS. 22 and 23, the first gate electrode 154a and the second gate electrode 154b including the lower layers 154ap and 154bp and the upper layers 154aq and 154bq, and the second capacitor electrode 158 made of a transparent conductor, are formed. Then a conductive impurity is doped into portions of the first semiconductor 135a and the second semiconductor 135b not overlapping the first gate electrode 154a and the second gate electrode 154b by using the first gate electrode 154a and the second gate electrode 154b as a mask to form the first source region 1356a and the first drain region 1357a, and the second source region 1356b and the second drain region 1357b of the first semiconductor 135a and the second semiconductor 135b.

As such, according to the manufacturing method of the display device according to the exemplary embodiment, the first gate electrode 154a and the second gate electrode 154b including the lower layers 154ap and 154bp and the upper layers 154aq and 154bq, and the second capacitor electrode 158 made of a transparent conductor, are formed by one exposure process. As a result, it is possible to prevent an increase in manufacturing cost in forming the second capacitor electrode 158.

Figure 24:
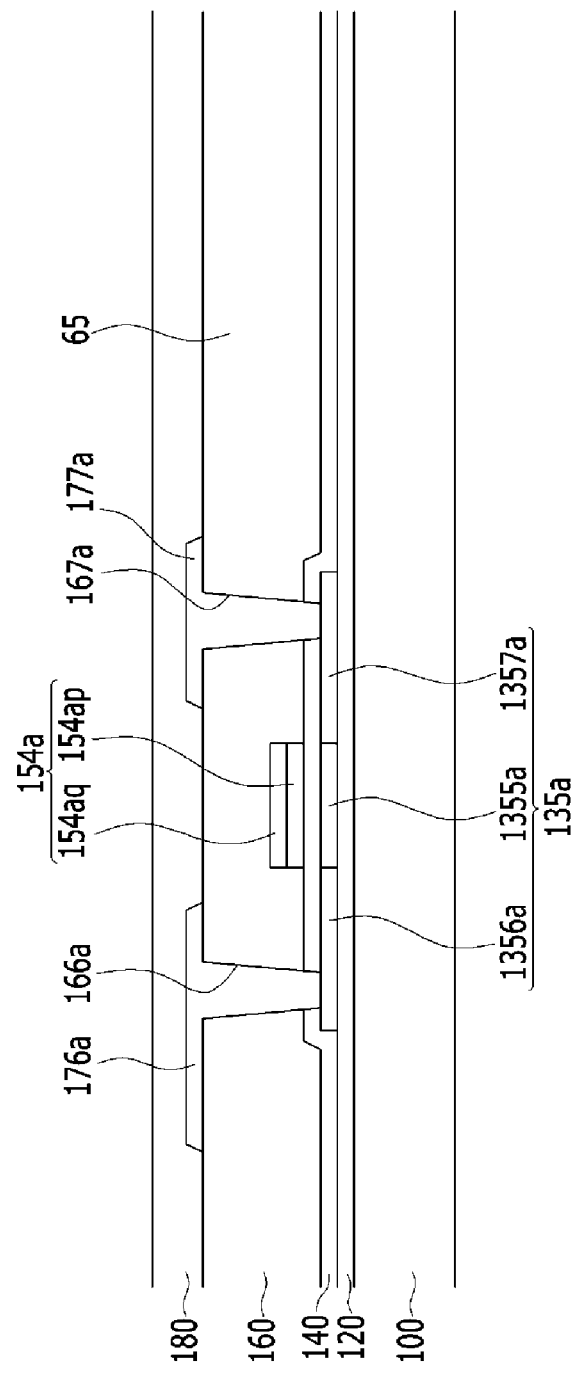
Figure 25:
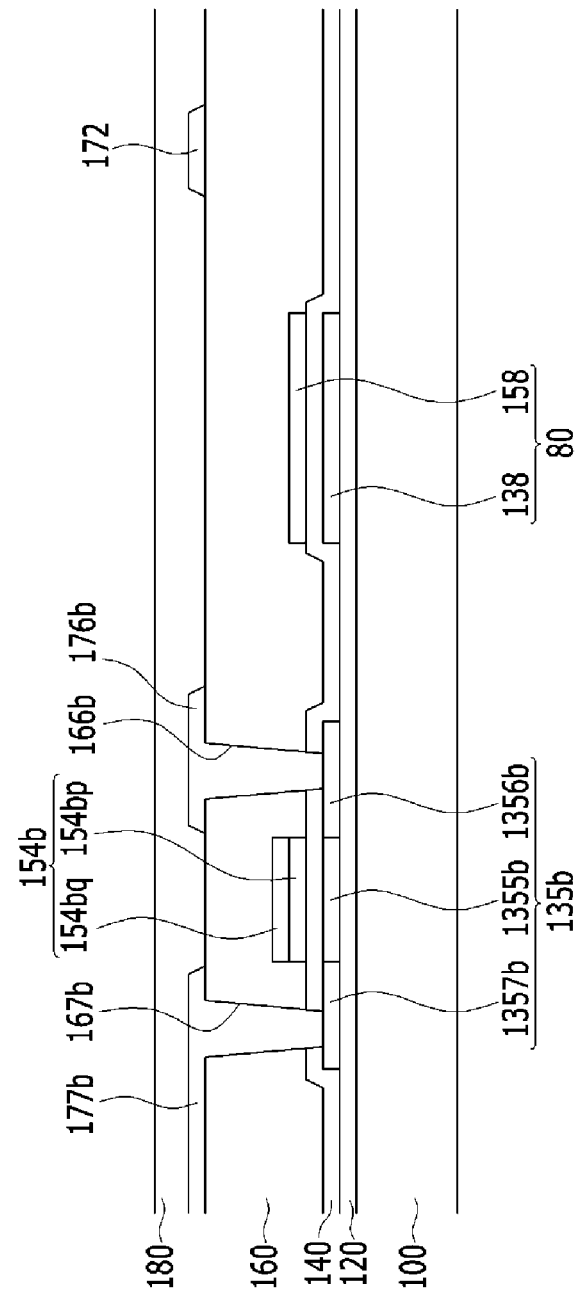

As illustrated in FIGS. 24 and 25, a first interlayer insulating layer 160 is formed on the gate line 121, the first gate electrode 154a, the second gate electrode 154b, and the second capacitor electrode 158. In this case, a first source contact hole 166a exposing the first source region 1356a of the first semiconductor 135a, a first drain contact hole 167a exposing the first drain region 1357a of the first semiconductor 135a, a second source contact hole 166b exposing the second source region 1356b of the second semiconductor 135b, and a second drain contact hole 167b exposing the second drain region 1357b of the second semiconductor 135b are formed in the first interlayer insulating layer 160 and the gate insulating layer 140, and a first contact hole 81 exposing the second gate electrode 154b is formed in the first interlayer insulating layer 160.

A data line 171 including the first source electrode 176a, a driving voltage line 172 including a second source electrode 176b, and a first drain electrode 177a and a second drain electrode 177b are formed on the first interlayer insulating layer 160.

The second interlayer insulating layer 180 is formed on the data line 171 including the first source electrode 176a, the driving voltage line 172 including the second source electrode 176b, and the first drain electrode 177a and the second drain electrode 177b. In this case, a second contact hole 82 exposing the second drain electrode 177b is formed in the second interlayer insulating layer 180.

Although not illustrated, according to a manufacturing method of a display device according to another exemplary embodiment of the present invention, a third interlayer insulating layer 180a is formed on the data line 171 including the first source electrode 176a, the driving voltage line 172 including the second source electrode 176b, and the first drain electrode 177a and the second drain electrode 177b; a color filer 230 is formed on the third interlayer insulating layer 180a; and a fourth interlayer insulating layer 180b may be formed on the third interlayer insulating layer 180a and the color filter 230. In this case, a second contact hole 82 exposing a second drain electrode 177b is formed in the third interlayer insulating layer 180a and the fourth interlayer insulating layer 180b.

Figure 26:
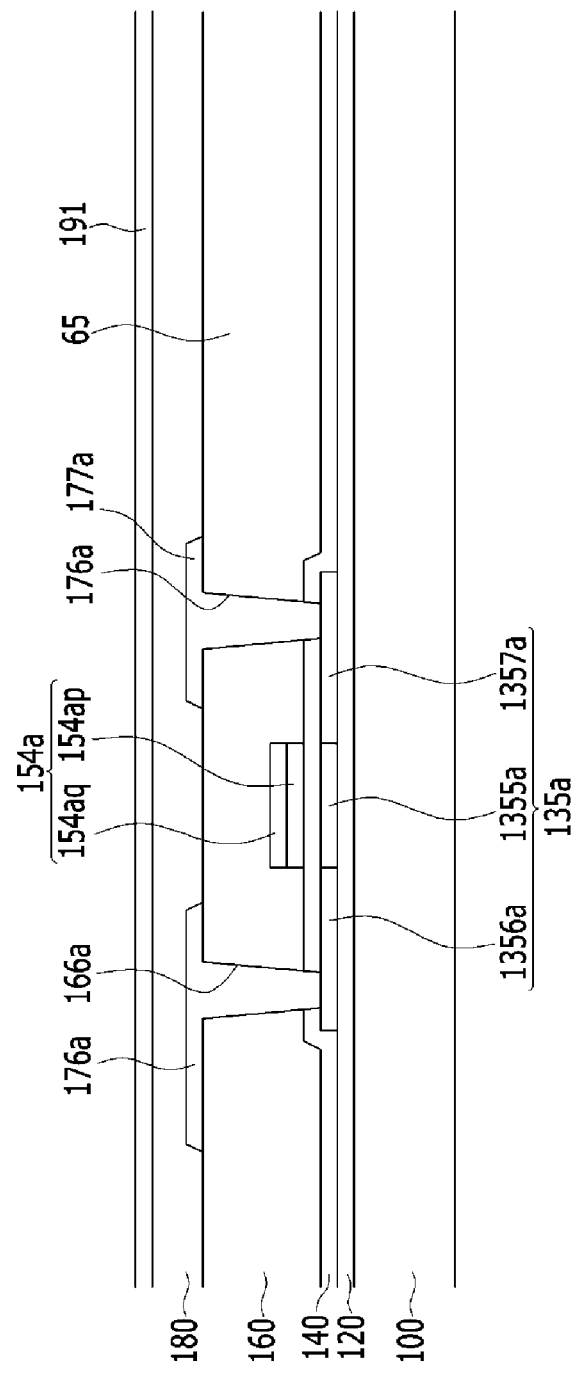
Figure 27:
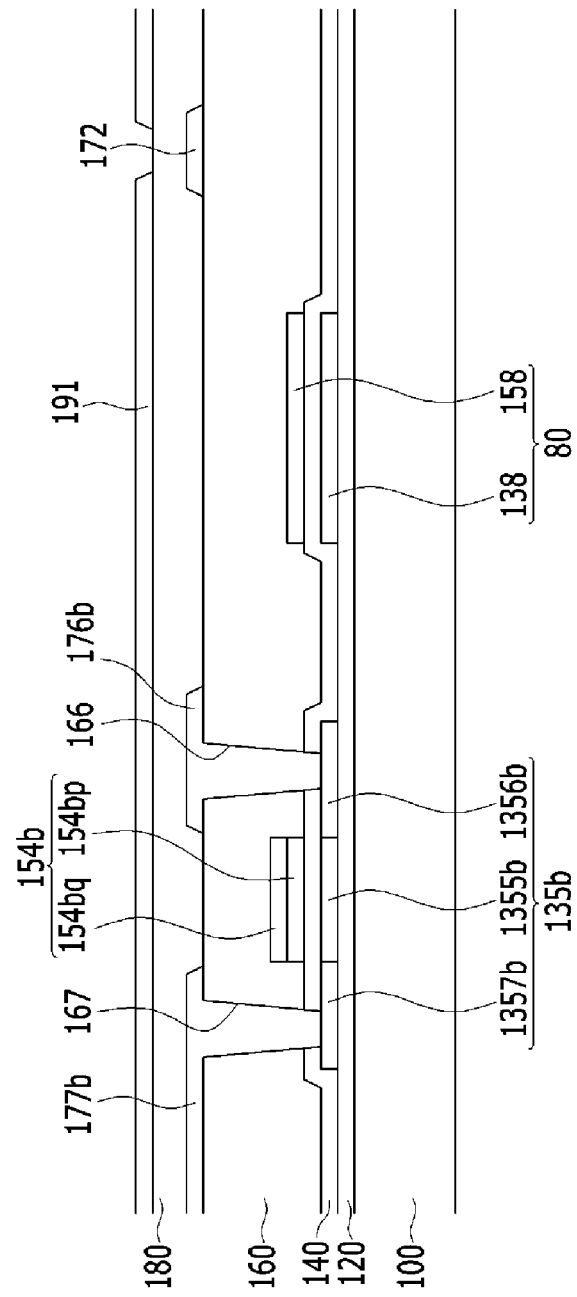

As illustrated in FIGS. 26 and 27, a first electrode 191 is formed on the second interlayer insulating layer 180. The first electrode 191 is formed throughout one pixel area which is surrounded by two adjacent gate lines 121, the data line 171, the driving voltage line 172, and the like. Further, an edge of the first electrode 191 may overlap the two adjacent gate lines 121, the data line 171, and the driving voltage line 172.

Figure 28:
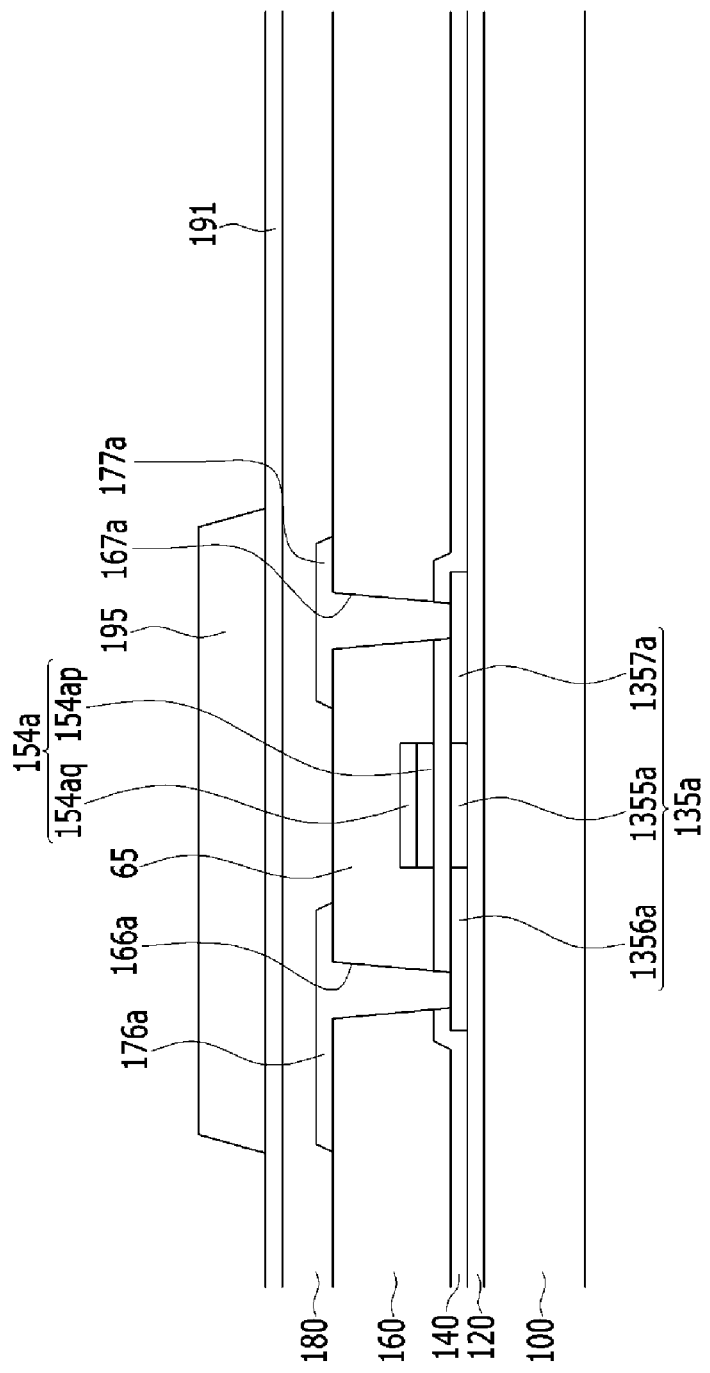
Figure 29:
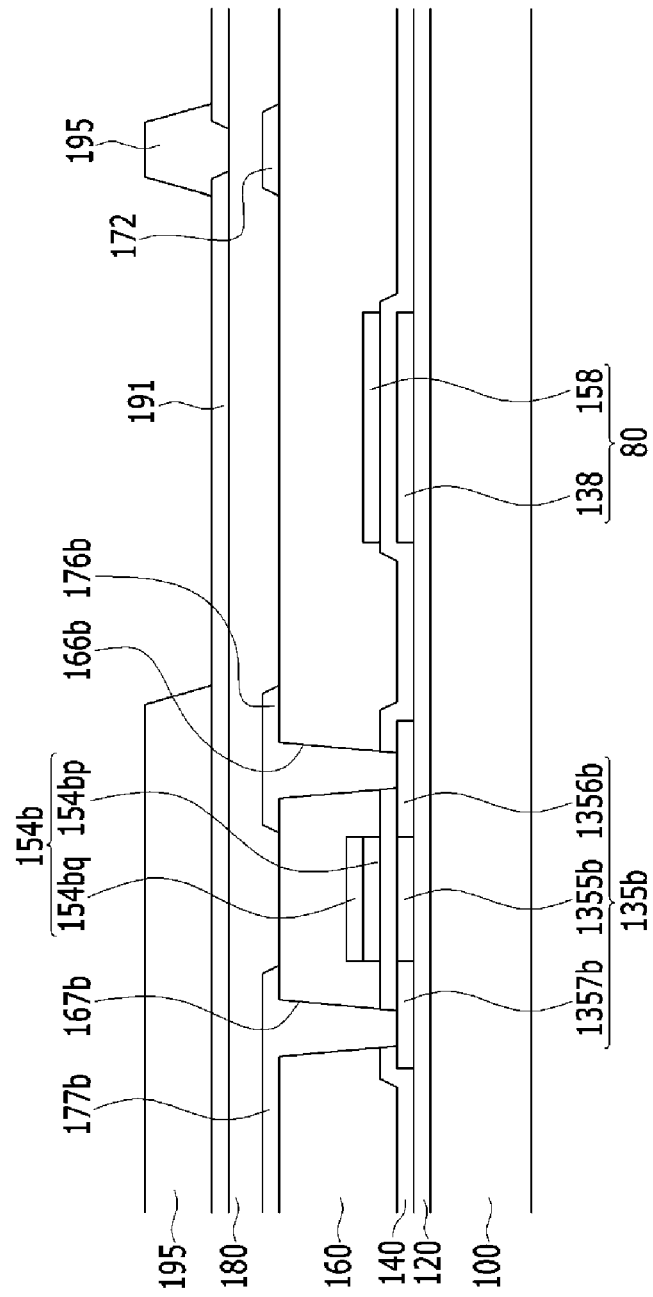
Figure 30:
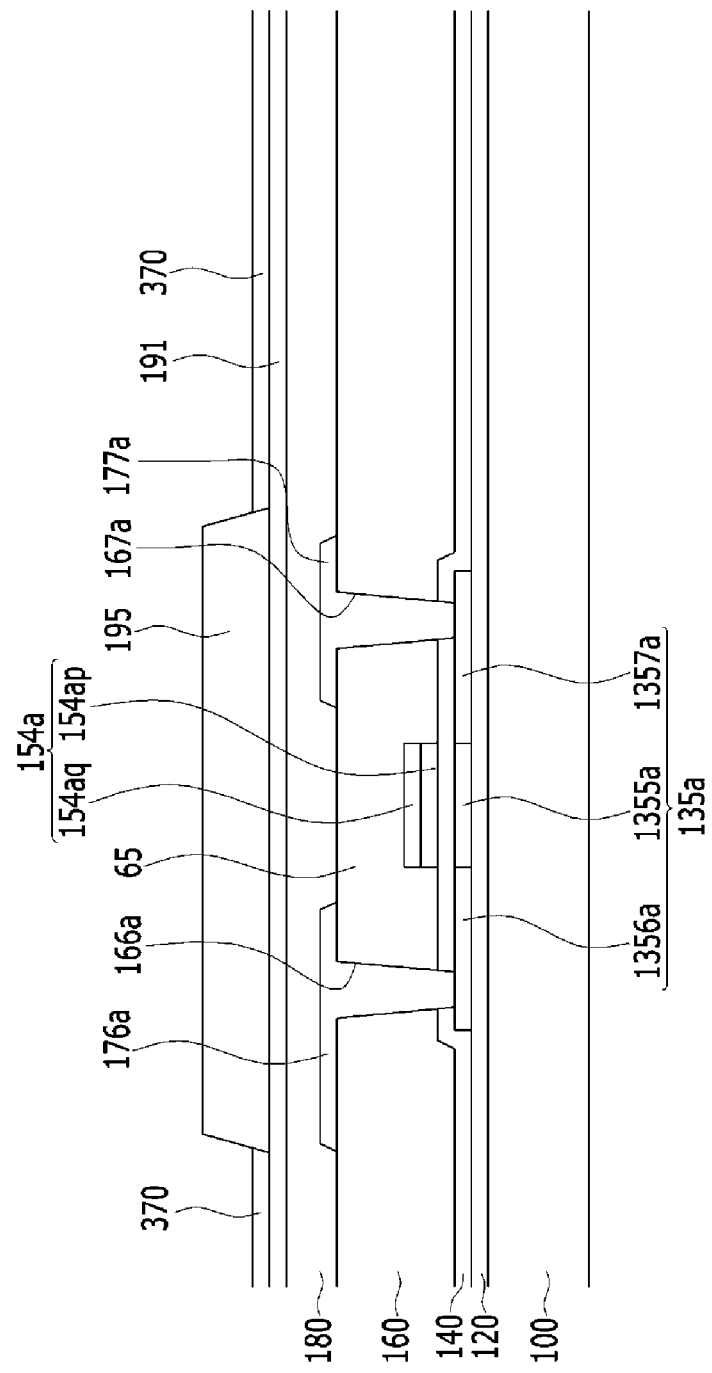
Figure 31:
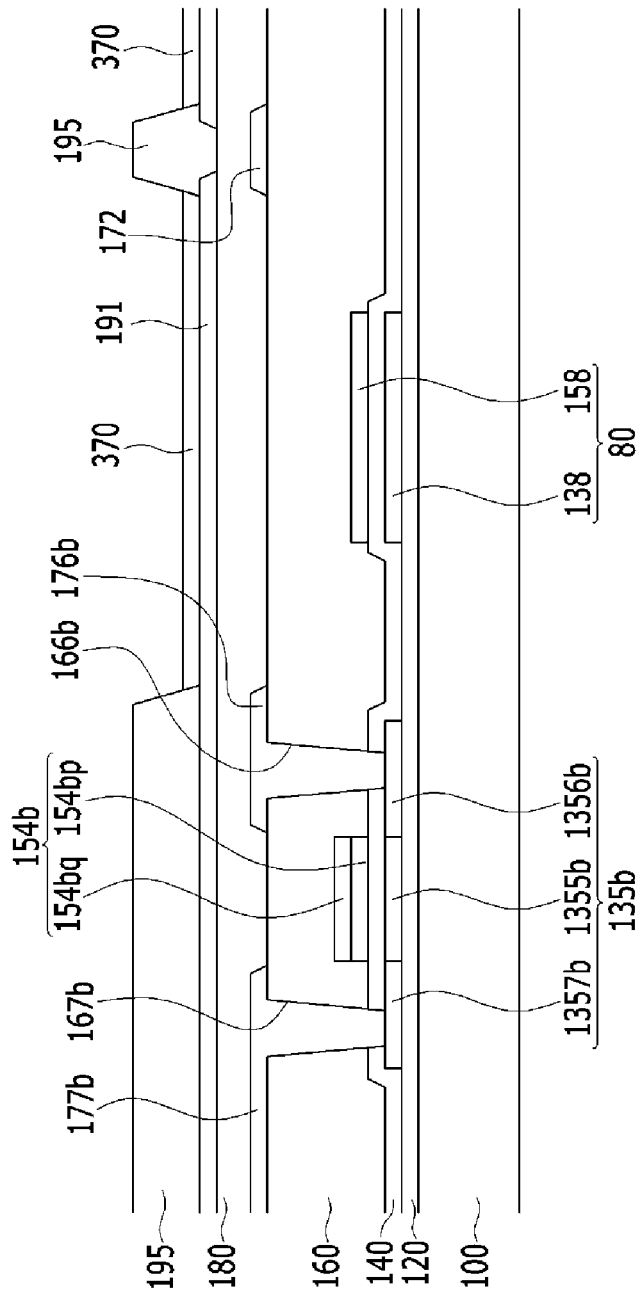

Referring to FIGS. 28 and 29, a pixel defining layer 195 is formed on the first electrode.

The pixel defining layer 195 is formed to overlap the gate line 121, the driving voltage line 172, the first gate electrode 154a, the second gate electrode 154b, the first source electrode 176a and the first drain electrode 177a, the second source electrode 176b and the second drain electrode 177b, and the like, which are formed as opaque layers.

According to a manufacturing method of a display device according to another exemplary embodiment of the present invention, an additional opaque layer may be further formed in addition to the gate line 121, the data line 171, the driving voltage line 172, the first gate electrode 154a, the second gate electrode 154b, the first source electrode 176a and the first drain electrode 177a, and the second source electrode 176b and the second drain electrode 177b, and in this case, the pixel defining layer 195 may be formed to overlap this additional opaque layer.

In more detail, with the organic emission layer 370 does not overlap the pixel defining layer 195. Thus, the organic emission layer 370 covers the entire pixel area except for the gate line 121, the data line 171, the driving voltage line 172, the first gate electrode 154a, the second gate electrode 154b, the first source electrode 176a and the first drain electrode 177a, the second source electrode 176b and the second drain electrode 177b, and the like, i.e. except for the opaque layers.

Next, as illustrated in FIGS. 3 and 4, a second electrode 270 is formed on the pixel defining layer 195 and the organic emission layer 370.

As such, according to the manufacturing method of the display device according to the exemplary embodiment of the present invention, the first electrode 191 is formed throughout the pixel area, the pixel defining layer 195 overlaps the opaque signal wire of the pixel area, the organic emission layer 370 is formed so as not to overlap the pixel defining layer 195, and the second electrode 270 is formed on the organic emission layer 370. Accordingly, as illustrated in FIGS. 3 and 4, the organic emission layer 370 emits light in a first region R1, a second region R2, a third region R3, and a fourth region R4 which do not overlap the opaque wire layer, so as to display an image. As such, the organic emission layer 370 covers areas typically not covered in conventional display devices, such as the area between the gate line 121 and the first source electrode 176a and the first drain electrode 177a, and a region between the driving voltage line 172 and the first drain electrode 177a, and as a result, an emission area of the display device is increased. The pixel defining layer 195 is formed only in areas that overlap the opaque signal wires of the pixel area, not an opening region in the pixel area, and as a result, an aperture ratio of the display device is increased. And the organic emission layer 370 of the display device is formed in regions surrounded by the pixel defining layer 195 and is not formed over the pixel defining layer 195. Further, even though the organic emission layer 370 of the display device emits the light, parts of the organic emission layer 370 are formed in the non-opening region. As a result, by preventing the organic emission layer 370 from unnecessarily emitting light even in the region where the image is not displayed, it is possible to prevent deterioration of emission efficiency while increasing an emission area of the display device.

Next, a manufacturing method of a display device according to another exemplary embodiment of the present invention will be described with reference to FIGS. 32 to 39 in addition to FIGS. 7 and 9. FIGS. 32 to 39 are cross-sectional views sequentially illustrating a manufacturing method of a display device according to another exemplary embodiment of the present invention.

Figure 32:
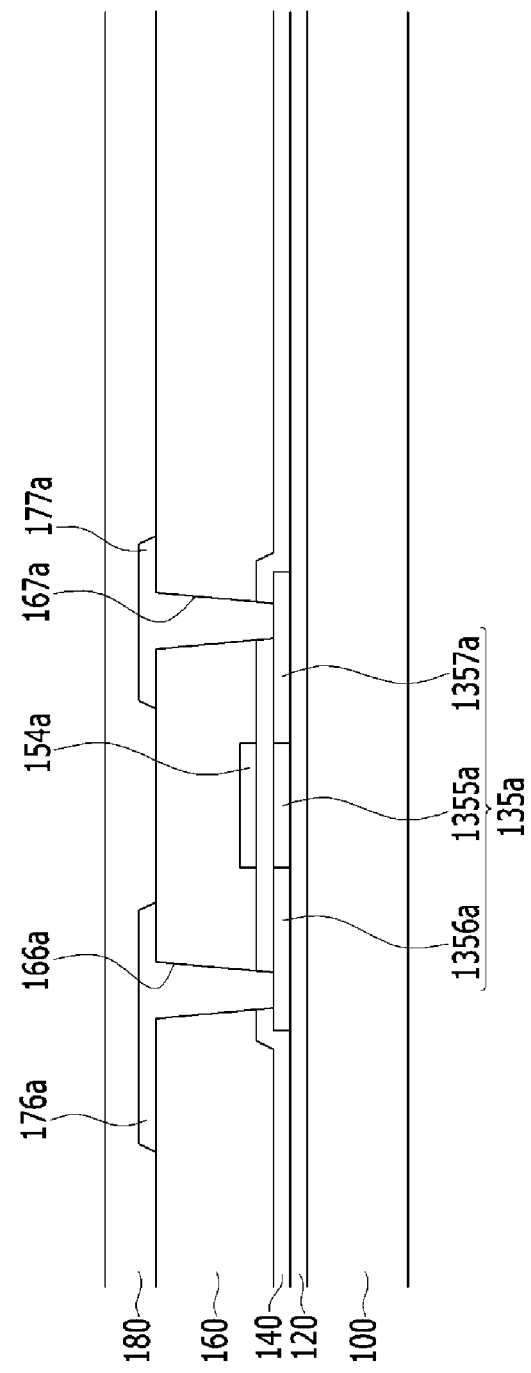
FIGS. 32, 33, 34, 35, 36, 37, 38, and 39 are cross-sectional views sequentially illustrating a method for manufacturing a display device according to another exemplary embodiment of the present invention.
Figure 33:
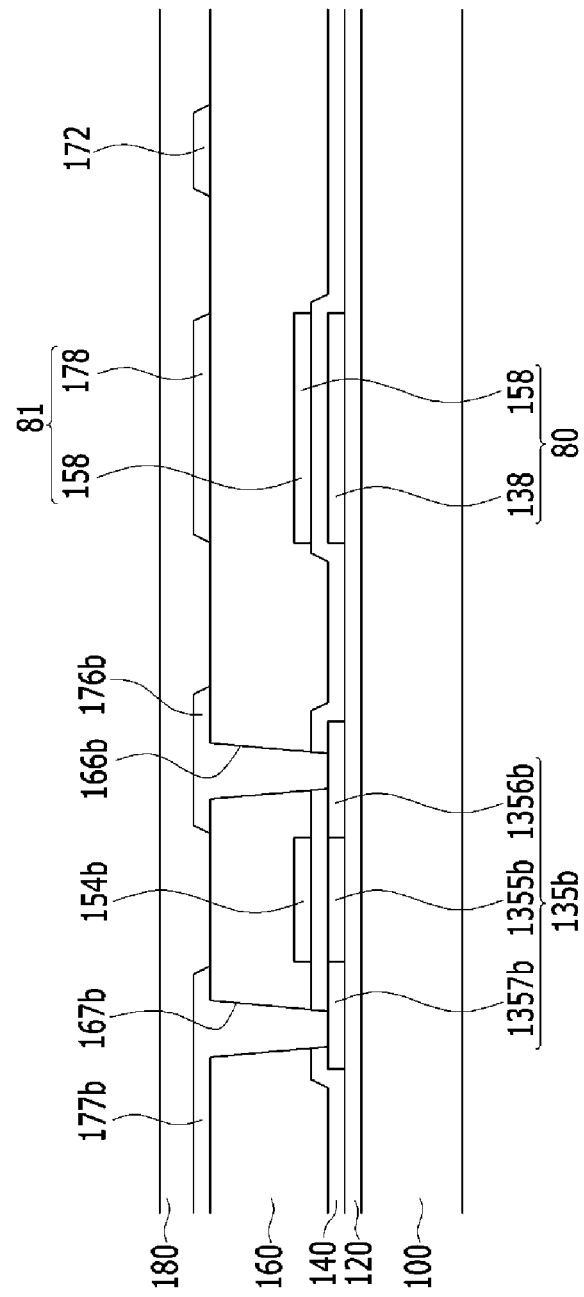

Referring to FIGS. 32 and 33, a buffer layer 120 is formed on a substrate 100, and a first semiconductor 135a, a second semiconductor 135b, and a first capacitor electrode 138 are formed on the buffer layer 120. In addition, a gate insulating layer 140 is formed on the first semiconductor 135a, the second semiconductor 135b, and the first capacitor electrode 138.

The first gate electrode 154a, the second gate electrode 154b, and the second capacitor electrode 158 each made of a transparent conductor are formed on the gate insulating layer 140.

The first interlayer insulating layer 160 is formed on the gate line 121, the first gate electrode 154a, the second gate electrode 154b and the second capacitor electrode 158, and a data line 171 including a first source electrode 176a, a driving voltage line 172 including a second source electrode 176b, a first drain electrode 177a and a second drain electrode 177b, and a third capacitor electrode 178 are formed on the first interlayer insulating layer 160. The third capacitor electrode 178 protrudes from the driving voltage line 172 and overlaps the second capacitor electrode 158.

The second interlayer insulating layer 180 is formed on the data line 171 including the first source electrode 176a, the driving voltage line 172 including the second source electrode 176b, and the first drain electrode 177a and the second drain electrode 177b.

Although not illustrated, according to a manufacturing method of a display device according to another exemplary embodiment of the present invention, a third interlayer insulating layer 180a may be formed on the data line 171 including the first source electrode 176a, the driving voltage line 172 including the second source electrode 176b, and the first drain electrode 177a and the second drain electrode 177b, a color filer 230 is formed on the third interlayer insulating layer 180a, and a fourth interlayer insulating layer 180b may be formed on the third interlayer insulating layer 180a and the color filter 230.

Figure 34:
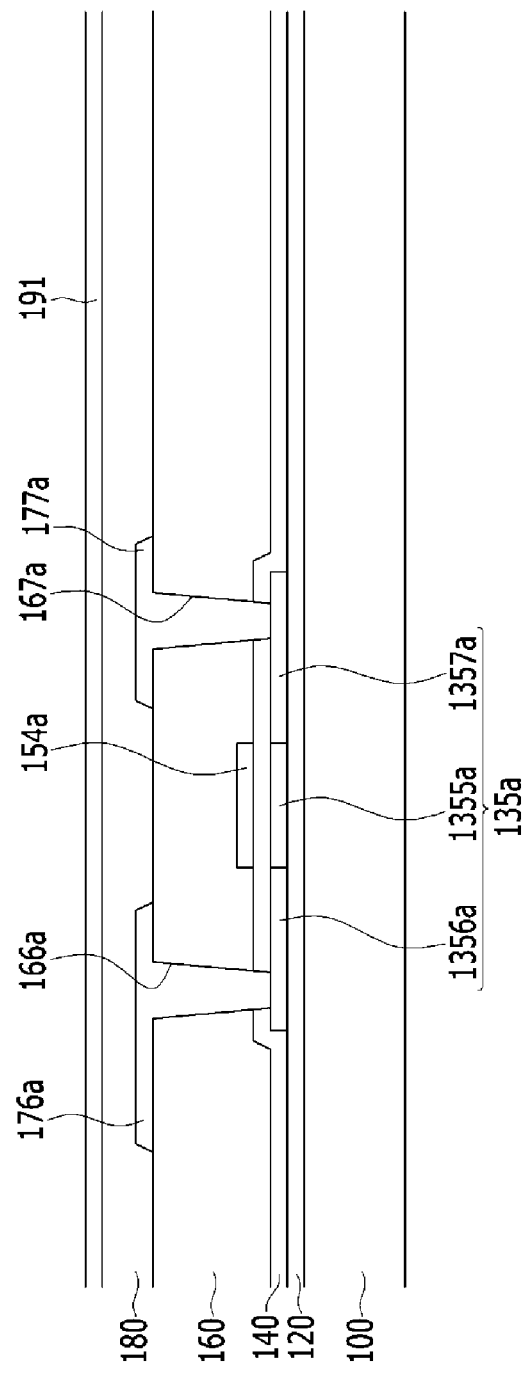
Figure 35:
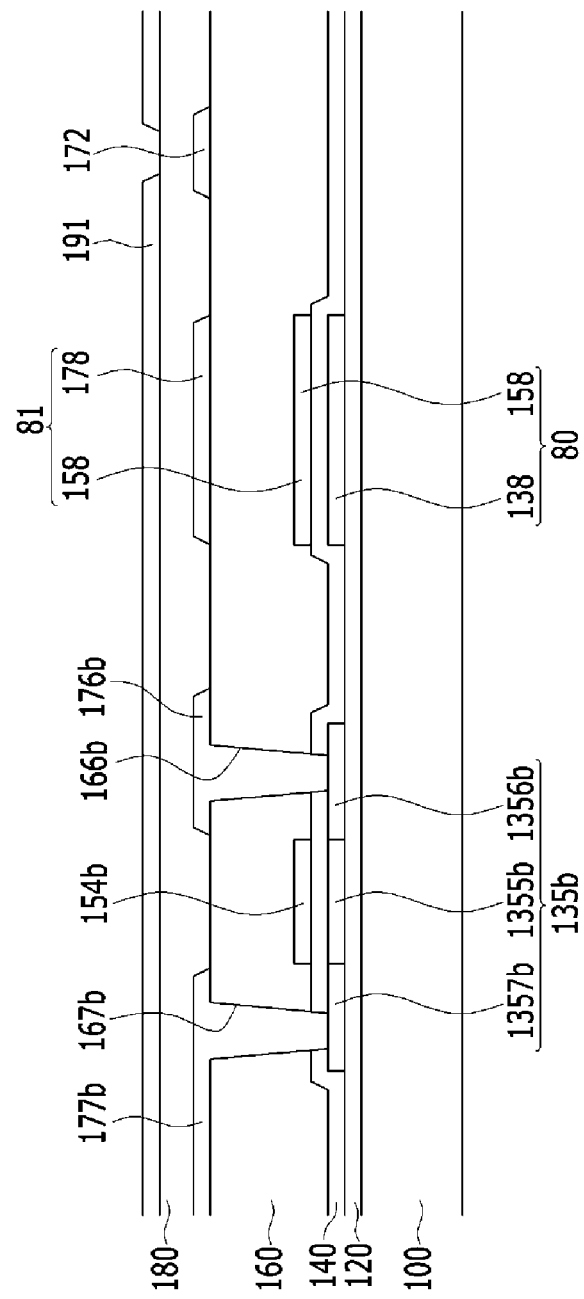

As illustrated in FIGS. 34 and 35, a first electrode 191 is formed on the second interlayer insulating layer 180. The first electrode 191 is formed throughout one pixel area which is surrounded by two adjacent gate lines 121, the data line 171, the driving voltage line 172, and the like. Further, an edge of the first electrode 191 may overlap the two adjacent gate lines 121, the data line 171, and the driving voltage line 172.

Figure 36:
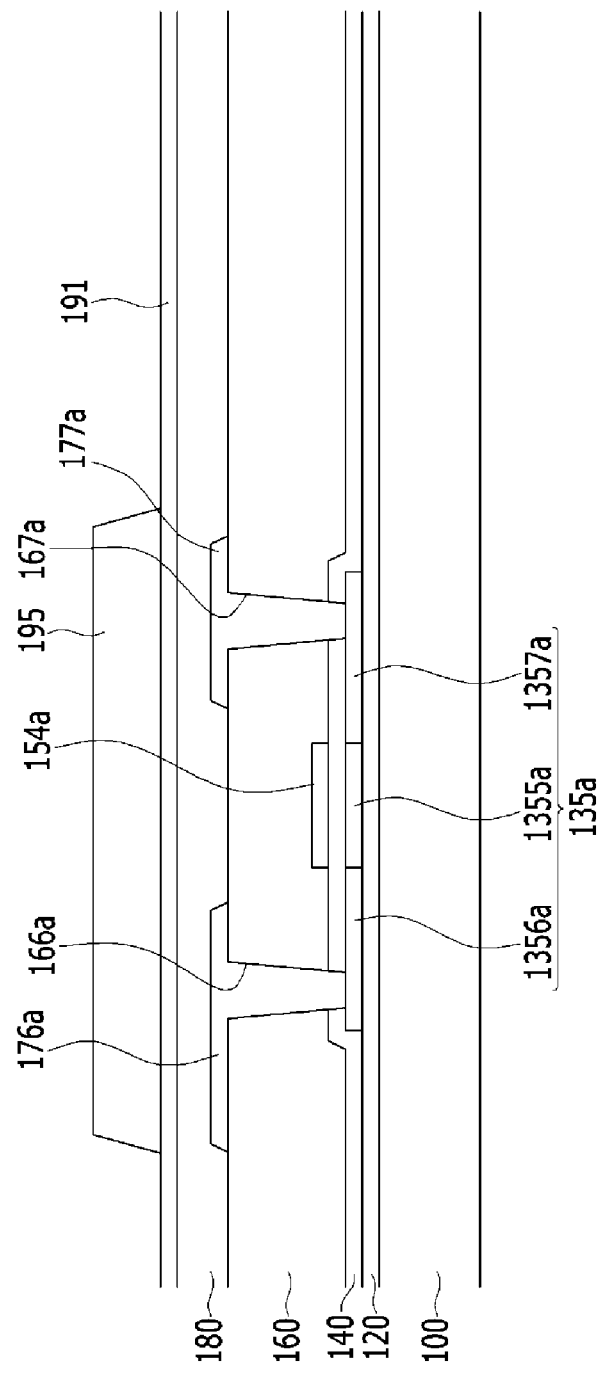
Figure 37:
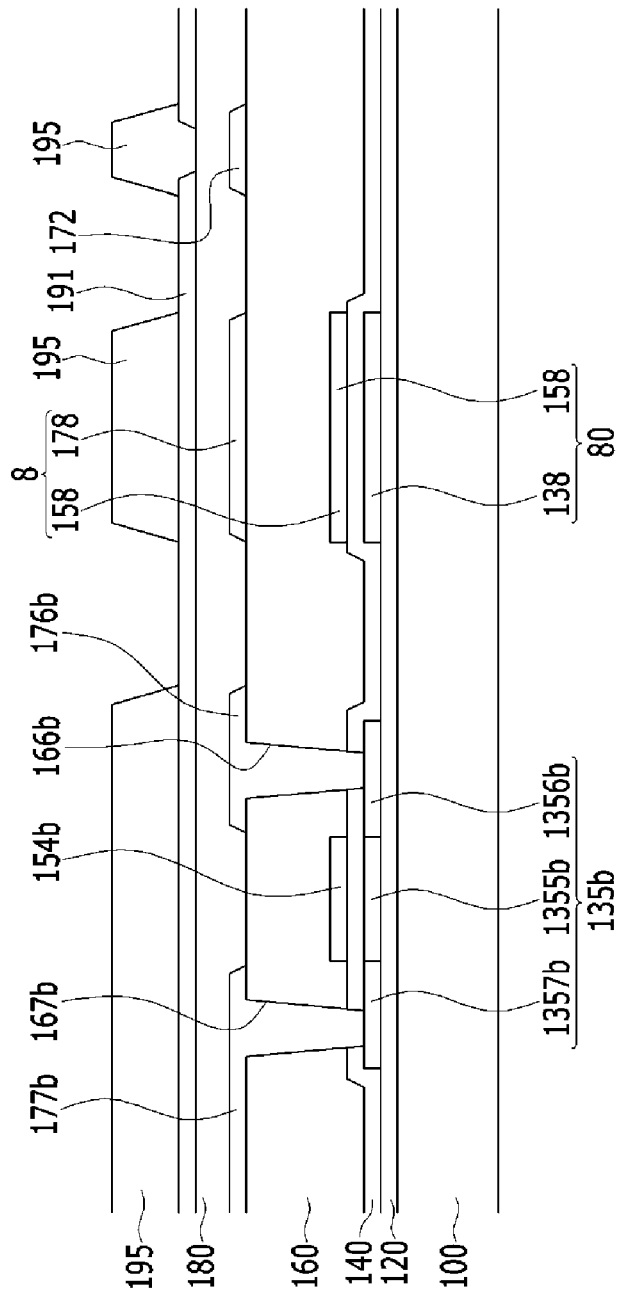

Referring to FIGS. 36 and 37, a pixel defining layer 195 is formed on the first electrode.

The pixel defining layer 195 is formed to overlap the gate line 121, the data line 171, the driving voltage line 172, the first gate electrode 154a, the second gate electrode 154b, the first source electrode 176a and the first drain electrode 177a, the second source electrode 176b and the second drain electrode 177b, and the like, which are formed as opaque layers.

According to a manufacturing method of a display device according to another exemplary embodiment of the present invention, an additional opaque layer may be further formed in addition to the gate line 121, the driving voltage line 172, the first gate electrode 154a, the second gate electrode 154b, the first source electrode 176a and the first drain electrode 177a, and the second source electrode 176b and the second drain electrode 177b, and in this case, the pixel defining layer 195 may be formed over this additional opaque layer as well.

Figure 38:
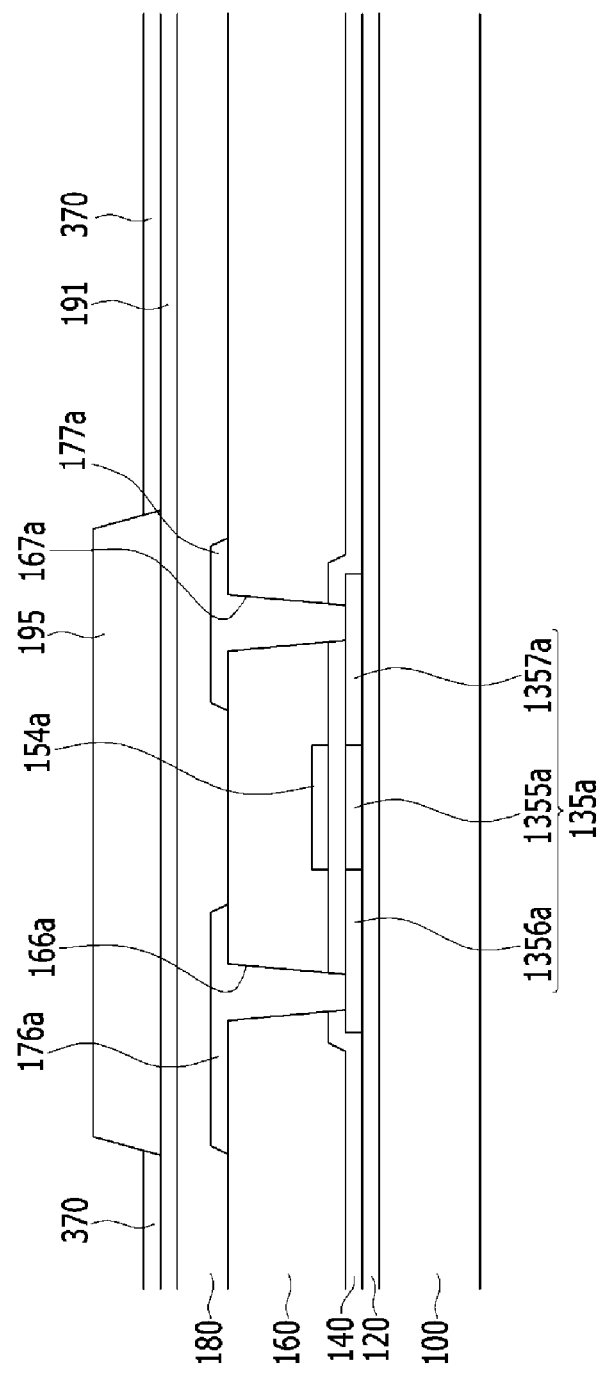
Figure 39:
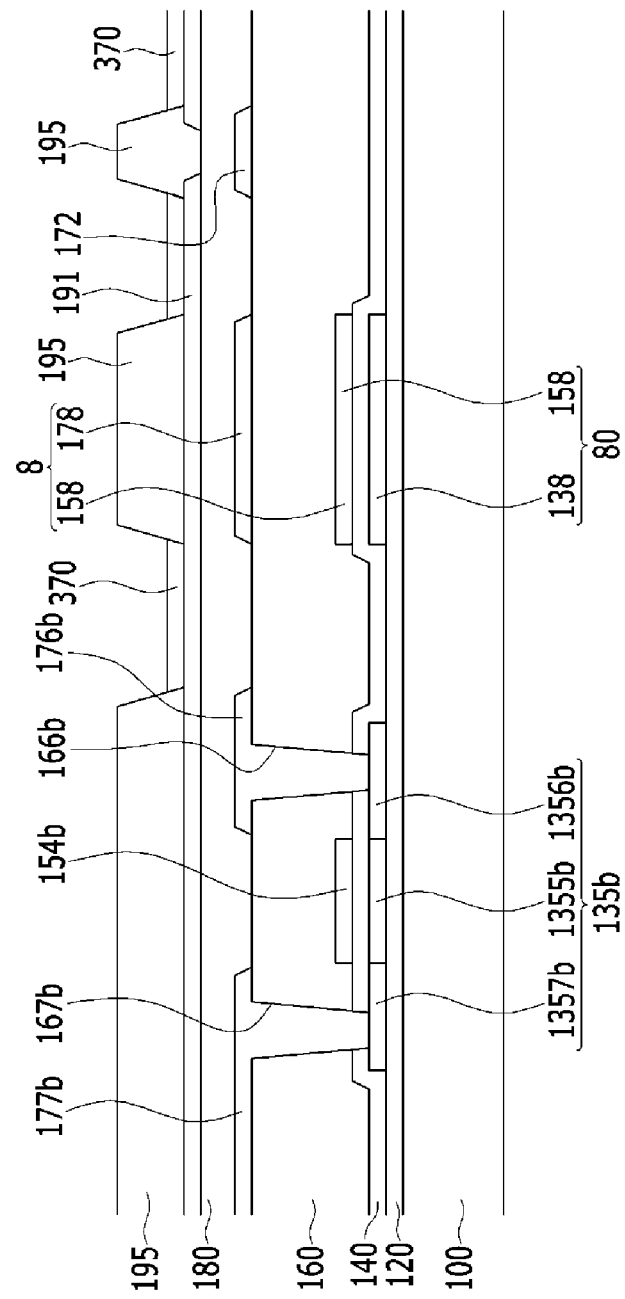

Referring to FIGS. 38 and 39, an organic emission layer 370 is formed on that part of the first electrode 191 which is not covered by the pixel defining layer 195. The organic emission layer 370 of the display device is formed in regions surrounded by the pixel defining layer 195 and is not formed over the pixel defining layer 195. Accordingly, the organic emission layer 370 covers the entire pixel area except for the gate line 121, the data line 171, the driving voltage line 172, the first gate electrode 154a, the second gate electrode 154b, the first source electrode 176a and the first drain electrode 177a, the second source electrode 176b and the second drain electrode 177b, and the like, which are formed as opaque layers.

Next, as illustrated in FIGS. 8 and 9, a second electrode 270 is formed on the pixel defining layer 195 and the organic emission layer 370.

As such, according to the manufacturing method of the display device according to the exemplary embodiment of the present invention, the first electrode 191 is formed throughout the pixel area, the pixel defining layer 195 is formed in areas over the opaque signal wire of the pixel area, the organic emission layer 370 is formed so as not to overlap the pixel defining layer 195, and the second electrode 270 is formed on the organic emission layer 370. Accordingly, as illustrated in FIGS. 8 and 9, the organic emission layer 370 emits light in a first region R1, a second region R2, a fourth region R4, and a fifth region R5 which do not overlap the opaque wire layer, so as to display an image. As such, the organic emission layer 370 is formed even in regions which are not display areas in conventional display devices, and as a result, an emission area of the display device is increased. The pixel defining layer 195 is formed over only the opaque signal wires of the pixel area, not an opening region in the pixel area, and as a result, an aperture ratio of the display device is increased. As a result, by preventing the organic emission layer 370 from unnecessarily emitting light even in the region where the image is not displayed, it is possible to prevent reduction in emission efficiency while increasing an emission area of the display device.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. The various features of each embodiment described herein can be mixed and matched with each other in any combination, to form embodiments and arrangements not shown herein but which would be understood by one of ordinary skill in the art.

<Description of symbols>

| | |
|---|---|
| 80, 8: Capacitor | 81, 82: Contact hole |
| 100: Substrate | 120: Buffer layer |
| 121: Gate line | 135a: First semiconductor |
| 135b: Second semiconductor | 138: First capacitor electrode |
| 140: Gate insulating layer | 154a: First gate electrode |
| 154b: Second gate electrode | 158: Second capacitor electrode |
| 160: First interlayer insulating layer | 166a, 166b: Source contact hole |
| 167a 167b: Drain contact hole | 171: Data line |
| 172: Driving voltage line | 176a, 176b: Source electrode |
| 177a, 177b: Drain electrode | 178: Third capacitor electrode |
| 180: Second interlayer insulating layer | 191: First electrode |
| 195: Pixel defining layer | 270: Second electrode |
| 370: Emission layer | 1355a, 1355b: Channel region |
| 1356a, 1356b: Source region | 1357a, 1357b: Drain region |

What is claimed is:

1. A display device, comprising:
a substrate;
signal lines disposed on the substrate, the signal lines including a gate line, a data line, and a driving voltage line;
a transistor connected to at least one of the signal lines and comprising a semiconductor layer, a gate insulating layer disposed on the semiconductor layer, a gate electrode disposed on the gate insulating layer, and a drain electrode and a source electrode connected to the semiconductor layer;
a first electrode disposed on portions of the signal lines and the transistor and connected to the transistor;
a pixel defining layer disposed on a portion of the first electrode and overlapping the signal lines and the transistor;
an organic emission layer disposed in regions surrounded by the pixel defining layer;
a second electrode disposed on the pixel defining layer and the organic emission layer; and
a first capacitor and a second capacitor disposed on the substrate,
wherein one of the first capacitor and the second capacitor includes a first capacitor electrode formed with the same layer as the semiconductor layer of the transistor and the other one of the first capacitor and the second capacitor includes a second capacitor electrode formed with the same layer as the drain electrode and the source electrode of the transistor.

2. The display device of claim 1,
wherein at least one of the first capacitor and the second capacitor comprises a third capacitor electrode formed with the same layer as the gate electrode of the transistor.

3. The display device of claim 2,
wherein the first capacitor electrode and the second capacitor electrode overlap with each other.

4. The display device of claim 3,
wherein the first capacitor electrode and the second capacitor electrode overlap with the third capacitor electrode.

5. The display device of claim 1,
wherein the first electrode comprises a first portion and a second portion, and
wherein the first portion of the first electrode overlaps pixel defining layer and the second portion of the first electrode overlaps the organic emission layer.

6. The display device of claim 5,
wherein the signal lines and the transistor overlapping the pixel defining layer are opaque.

7. The display device of claim 6,
wherein the organic emission layer is not disposed on the pixel defining layer and does not overlap the signal lines and the transistor overlapping the pixel defining layer.

8. The display device of claim 1,
wherein the first capacitor electrode and the second capacitor electrode overlap with each other.

9. The display device of claim 1,
wherein the first electrode comprises a first portion and a second portion, and
wherein the first portion of the first electrode overlaps pixel defining layer and the second portion of the first electrode overlaps the organic emission layer.

10. The display device of claim 9,
wherein the signal lines and the transistor overlapping the pixel defining layer are opaque.

11. The display device of claim 10,
wherein the organic emission layer is not disposed on the pixel defining layer and does not overlap the signal lines and the transistor overlapping the pixel defining layer.

12. The display device of claim 1, wherein:
the organic emission layer is not disposed on the pixel defining layer and does not overlap the signal lines and the transistor overlapping the pixel defining layer.

13. A display device including a plurality of pixels displaying a primary colors and a white color, comprising:
a substrate;
signal lines disposed on the substrate, the signal lines including a gate line, a data line, and a driving voltage line;
a transistor connected to at least one of the signal lines and comprising a semiconductor layer, a gate insulating layer disposed on the semiconductor layer, a gate electrode disposed on the gate insulating layer, and a drain electrode and a source electrode connected to the semiconductor layer;
a first electrode disposed on portions of the signal lines and the transistor and connected to the transistor;
a pixel defining layer disposed on a portion of the first electrode and overlapping the signal lines and the transistor;
an organic emission layer disposed in regions surrounded by the pixel defining layer;
a second electrode disposed on the pixel defining layer and the organic emission layer; and
a first capacitor and a second capacitor disposed on the substrate,
wherein one of the first capacitor and the second capacitor includes a first capacitor electrode formed with the same layer as the semiconductor layer of the transistor and the other one of the first capacitor and the second capacitor includes a second capacitor electrode formed with the same layer as the drain electrode and the source electrode of the transistor.

14. The display device of claim 13,
wherein at least one of the first capacitor and the second capacitor comprises a third capacitor electrode formed with the same layer as the gate electrode of the transistor.

15. The display device of claim 14,
wherein the first capacitor electrode and the second capacitor electrode overlap with each other.

16. The display device of claim 15,
wherein the first capacitor electrode and the second capacitor electrode overlap with the third capacitor electrode.

17. The display device of claim 13,
wherein the first electrode comprises a first portion and a second portion, and
wherein the first portion of the first electrode overlaps pixel defining layer and the second portion of the first electrode overlaps the organic emission layer.

18. The display device of claim 17,
wherein the signal lines and the transistor overlapping the pixel defining layer are opaque.

19. The display device of claim 18,
wherein the organic emission layer is not disposed on the pixel defining layer and does not overlap the signal lines and the transistor overlapping the pixel defining layer.

20. The display device of claim 13, wherein:
the organic emission layer is not disposed on the pixel defining layer and does not overlap the signal lines and the transistor overlapping the pixel defining layer.

* * * * *